(12) United States Patent
Brant et al.

(10) Patent No.: US 11,029,347 B2
(45) Date of Patent: Jun. 8, 2021

(54) ELECTRONICS EQUIPMENT TESTING APPARATUS AND METHOD UTILIZING UNINTENDED RF EMISSION FEATURES

(71) Applicant: NOKOMIS, INC., Charleroi, PA (US)

(72) Inventors: Adam Brant, Bethel Park, PA (US); Walter J. Keller, III, Bridgeville, PA (US); Todd Eric Chornenky, Carmichaels, PA (US)

(73) Assignee: NOKOMIS, INC, Charleroi, PA (US)

(*) Notice: Subject to any disclaimer, the term of this patent is extended or adjusted under 35 U.S.C. 154(b) by 396 days.

(21) Appl. No.: 15/963,232

(22) Filed: Apr. 26, 2018

(65) Prior Publication Data

US 2018/0313877 A1 Nov. 1, 2018

Related U.S. Application Data

(60) Provisional application No. 62/490,244, filed on Apr. 26, 2017.

(51) Int. Cl.
| | | |
|---|---|---|
| *G01R 23/02* | (2006.01) |
| *H01Q 1/36* | (2006.01) |
| *H04B 1/16* | (2006.01) |
| *G01R 31/00* | (2006.01) |
| *G01R 29/08* | (2006.01) |
| *H01Q 13/02* | (2006.01) |

(52) U.S. Cl.
CPC ......... *G01R 23/02* (2013.01); *G01R 29/0878* (2013.01); *G01R 31/003* (2013.01); *H01Q 1/36* (2013.01); *H01Q 13/02* (2013.01); *H04B 1/16* (2013.01)

(58) Field of Classification Search
CPC .. G01R 23/02; G01R 29/0878; G01R 31/003; H01Q 1/36; H01Q 13/02; H04B 1/16
See application file for complete search history.

(56) References Cited

U.S. PATENT DOCUMENTS

| | | |
|---|---|---|
| 7,515,094 B2 | 4/2009 | Keller, III |
| 8,063,813 B1 | 11/2011 | Keller |
| 8,537,050 B2 | 9/2013 | Freeman et al. |
| 8,643,539 B2 | 2/2014 | Pauly et al. |
| 8,825,823 B2 | 9/2014 | Keller, III |
| 9,059,189 B2 | 6/2015 | Keller, III et al. |
| 9,285,463 B1 | 3/2016 | Freeman et al. |
| 9,562,962 B2 | 2/2017 | Keller, III |
| 9,658,314 B2 | 5/2017 | Parks et al. |

(Continued)

*Primary Examiner* — Alexander Satanovsky
*Assistant Examiner* — Lynda Dinh
(74) *Attorney, Agent, or Firm* — AP Patents

(57) ABSTRACT

A hand-held apparatus for analysis, testing, inspecting and/or screening a fully integrated and assembled electrically powered assets and devices for measurement of degree of device aging, degradation, condition, and/or Remaining Useful Life (RUL). The device includes an on-board antenna positioned at a distance from the electrically powered device under test and a signal receiver or sensor for examining a signal from the electrically powered device, but especially applied to electronic devices. The receiver or sensor collects unintended and/or intended RF energy components emitted by the electrically powered device and performs the above analysis in a response to the acquired signal input while the electrically powered device is active or powered.

20 Claims, 14 Drawing Sheets

(56) References Cited

U.S. PATENT DOCUMENTS

| | | |
|---|---|---|
| 9,851,386 B2 | 12/2017 | Keller, III et al. |
| 2012/0226463 A1 | 9/2012 | Keller, III et al. |
| 2013/0229310 A1* | 9/2013 | Parks ................. G01S 3/46 |
| | | 342/417 |
| 2013/0328710 A1 | 12/2013 | Keller, III |
| 2015/0358337 A1* | 12/2015 | Keller .............. G06F 11/00 |
| | | 726/23 |
| 2016/0098561 A1* | 4/2016 | Keller ............. G06F 21/567 |
| | | 726/24 |
| 2016/0116422 A1 | 4/2016 | Portune et al. |

\* cited by examiner

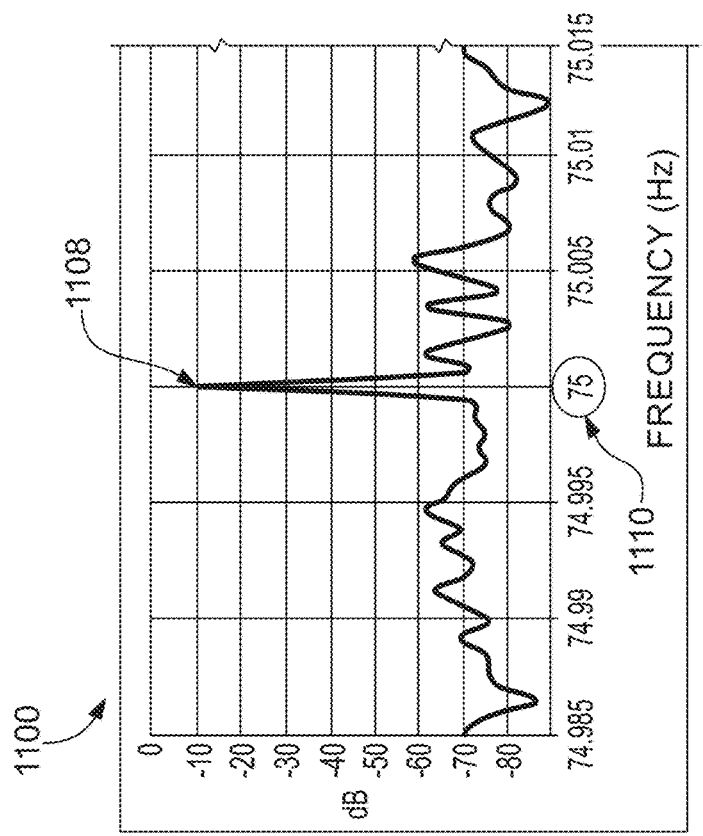

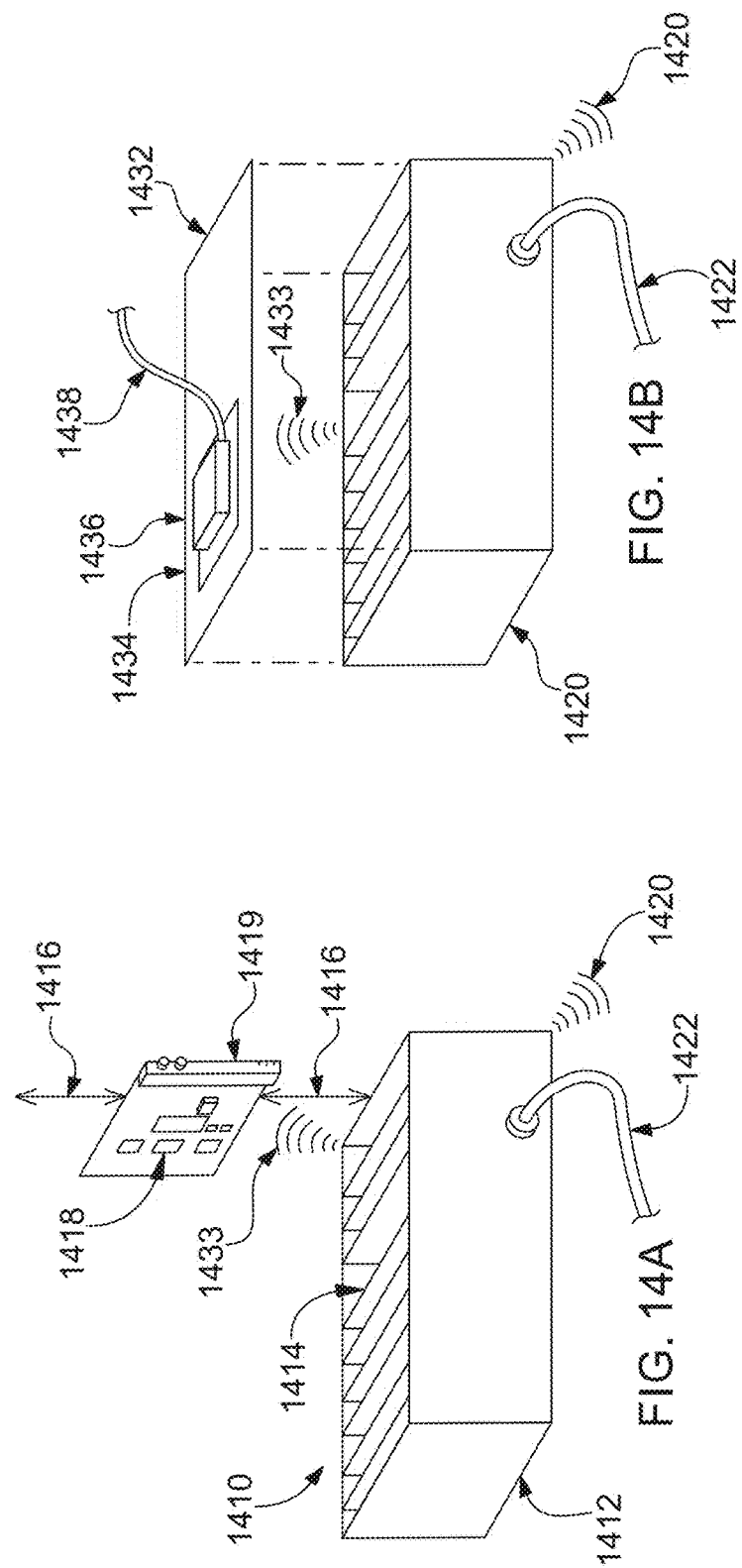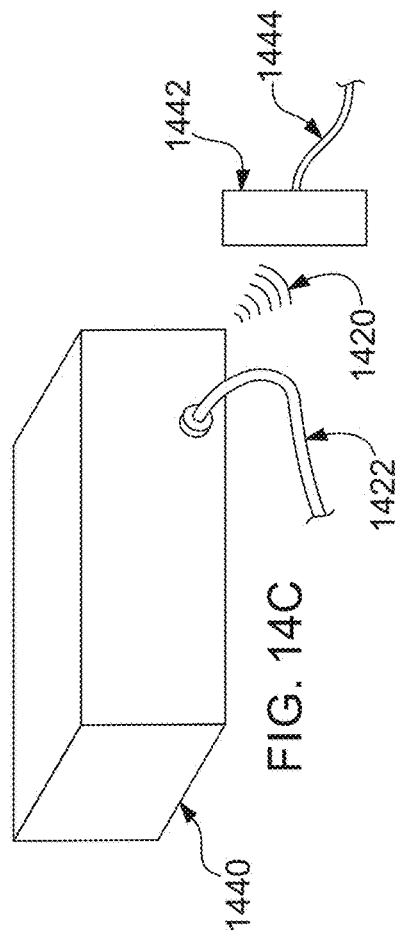
FIG. 14A
FIG. 14B
FIG. 14C

ELECTRONICS EQUIPMENT TESTING APPARATUS AND METHOD UTILIZING UNINTENDED RF EMISSION FEATURES

CROSS REFERENCE TO RELATED APPLICATIONS

The present non-provisional application is related to and claims benefit of and priority from provisional U.S. patent application Ser. No. 62/490,244, titled "Electronics equipment testing apparatus and method utilizing unintended RF emission features" and filed on Apr. 26, 2017 by Applicant Nokomis Inc., the entire contents of which are hereby incorporated by reference thereto. This present non-provisional application is also related to a co-pending non-provisional application Ser. No. 15/963,325, titled "Electronics card insitu testing apparatus and method utilizing unintended RF emission features" and published as US 2018-0316082 A1 on Nov. 1, 2018, which is incorporated hereby in its entirety by reference thereto.

This document incorporates by reference the entire contents of disclosures and/or teachings of the following documents: U.S. Pat. No. 7,515,094 entitled "Advanced electromagnetic location of electronic equipment"; U.S. Pat. No. 8,063,813 entitled "Active improvised explosive device (IED) electronic signature detection"; U.S. Pat. No. 8,537,050 entitled "Identification and analysis of source emissions through harmonic phase comparison"; U.S. Pat. No. 8,643,539 entitled "Advance manufacturing monitoring and diagnostic tool"; U.S. Pat. No. 8,825,823 entitled "System and method for physically detecting, identifying, diagnosing and geolocating electronic devices connectable to a network"; U.S. Pat. No. 9,059,189 entitled "INTEGRATED CIRCUIT WITH ELECTROMAGNETIC ENERGY ANOMALY DETECTION AND PROCESSING"; US Pub. 2012-0226463 entitled "SYSTEM AND METHOD FOR PHYSICALLY DETECTING COUNTERFEIT ELECTRONICS"; U.S. Pat. No. 9,658,314 entitled "SYSTEM AND METHOD FOR GEO-LOCATING AND DETECTING SOURCE OF ELECTROMAGNETIC EMISSIONS"; US Pub. 2013-0328710, entitled "Identification and Analysis of Source Emissions through Harmonic Phase Comparison"; U.S. Pat. No. 9,285,463 entitled "Method and Apparatus for battle damage assessment of electric or electronic devices"; U.S. Pat. No. 9,851,386 entitled "Method and Apparatus for Detection and Identification of Counterfeit and Substandard Electronics"; and U.S. Pat. No. 9,562,962 entitled "System and Method for Physically Detecting, Identifying, Diagnosing and Geolocating Electronic Devices Connectable to a network".

STATEMENT REGARDING FEDERALLY SPONSORED RESEARCH AND DEVELOPMENT

This subject matter was made with government support under Small Business Innovation Research (SBIR) Contract NNX15CA20C awarded by the NASA agency. The government has certain rights in this subject matter.

REFERENCE TO SEQUENCE LISTING, A TABLE, OR A COMPUTER PROGRAM LISTING COMPACT DISC APPENDIX

N/A

BACKGROUND

1. Technical Field

The subject matter relates, in general, to a system and method for detecting aging or degradation in electrical and/or electronic devices. This subject matter further relates to avionics equipment and electronics. The subject matter recognizes changes, patterns or characteristics in the intended or unintended electromagnetic emissions given off by the electrically powered devices, particularly due to aging or degradation effect.

2. Description of Related Art

Conventionally, employed solutions to the problem of detecting aging in electronic devices and, particularly, avionics equipment can utilize methods which are inaccurate and are based on accumulated hours of operation. These methods may not typically detect impending component or equipment failures which can occur before the equipment reaches the end of its Remaining Useful Life (RUL), nor it may detect equipment that, albeit is aged, still retains significant useful life, thus potentially saving premature replacement costs of equipment which is older by age but still has sufficient RUL. Alternative methods can typically use simple accumulated runtime and expected Mean Time Between Failure (MTBF) metrics. This again can be inaccurate and typically requires additional equipment removal and testing events and higher net equipment costs than needed, and adds risk of premature failure(s). Removal of device before it is truly near inoperability and can add technician time resources in device removal and replacement. Early replacement and unnecessary redundancy can squander thousands of hours of useful life still possible with good equipment while still allowing costly and potentially deadly failures to occur in unevenly stressed systems. The above methods also do not address components that may be inadequate or out-of-specification due to manufacturing variation or the placement of obsolete, malfunctioning, or counterfeit parts and/or ICs placed in new systems, either accidentally or intentionally. Further, the above methods may require an intrusive means, such as removal of equipment to a lab for testing and then subsequent replacement to accomplish their goal. The above test methodologies may not be applicable, in a nonintrusive way, in testing of equipment mounted within racks, enclosures or panels. These racks, enclosures or panels can be provided in vehicles such as planes, ships, submarines, automobiles, rockets, missiles, trains, busses and the like. Additional disadvantages of the conventional methods can include, without limitation, inability or difficulty in adequately find stressed parts likely to undergo imminent failure, requirements for benchtop testing equipment and connection of power and/or signals thereto, challenges in acquiring, from a distance, useful baseline of operations, baseline characteristics, or baseline behavior, testing of the components or equipment during use or operations of the vehicle(s)

The conventional test methodologies can be incapable of unobtrusively detecting loose connections or degraded cabling in hardware components or software subsystems. Unit tests run on individual components or regression tests performed can be only capable of assessing current state of operation. Tests run on these components cannot prognosticate the component's RUL.

As the complexity of electronic components, particularly used in avionics and "fly-by-wire" systems increases, and fully automatic control of aircraft continues to evolve, the need for advanced tools for testing electronic components and equipment becomes ever more apparent.

Failure and, particularly a premature failure, of electronic component(s) in avionic applications, can cause a navigation loss, or a radio communications loss, compromising the operability of the entire aircraft, even with a loss of equipment and lives.

Thus, there exists a compelling need for improved devices and methods to at least screen, detect, and estimate RUL of electronic components and/or equipment avionics and aircraft control systems, which currently rely on time intensive manual maintenance procedures or time-of-operation logging.

There is a further need for a separate, isolated, portable, unobtrusive, non-contact, and/or attachment-free and hand-held apparatus for inspection of suspected equipment or electrically powered devices to determine RUL.

BRIEF DESCRIPTION OF THE DRAWINGS

FIGS. 11A-11B illustrate an example electromagnetic spectrum showing the 15$^{th}$ harmonic 1108 and 18$^{th}$ harmonic 1104 of a 5 MHz harmonic series;

FIGS. 14A-14C illustrate an emissions monitoring device outside a card.

DESCRIPTION OF FIGURE ELEMENTS

Figure 1:
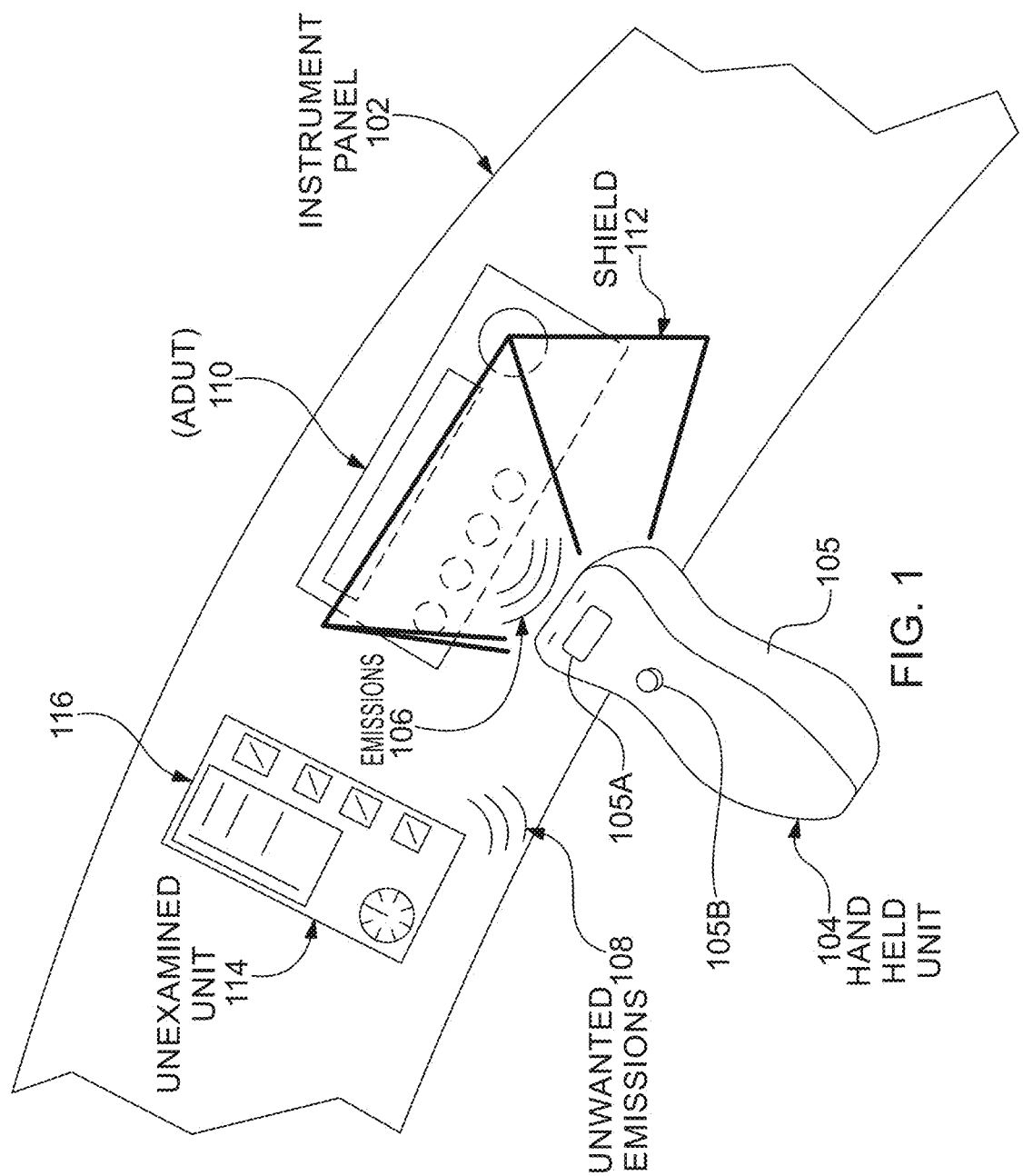
FIG. 1 illustrates an exemplary embodiment of a hand-held apparatus for testing electrical or electronic device(s)

102—Instrument Panel
104—Hand Held Unit
106—Emissions
108—Unwanted Emissions or emissions that may interfere with emissions being monitored
110—(DUT)
112—Shield
114—Unexamined Unit
116—2$^{nd}$ Electronics Device Emitting Unwanted Emissions
200—A Possible Handheld Embodiment
202—RF Connector
204—Hand Held Unit
206—Degradation Status on Display
208—Display
210—Soft Keys
212—Function Keys for Navigation
214—Keypad
300—Illustration of a Possible Embodiment Used Outside an Instrument Panel—Side view
302—Hand Held Unit
304—Keypad
306—Display
308—Horn Antenna and/or RF Shield
310—Distance Measuring Hardware
314—Time of Flight Laser Beams, Ultrasound Beam, Measured Length Rods or other Registration Means
316—Unintended Emissions
318—Registration Points
320—Equipment to be tested for RUL
322—Processor Board Emitting Unintended Emissions
324—Dashboard or Instrument Panel Front
326—Unintended Emissions
328—LNA(s)
330—RF Detector
332—Simple User Interface Panel, HMI or Computer for GUI output
400—Illustration of an Apparatus Configured to test Instruments in an Instrument Panel and Replaceable Antennas which can be used with the Apparatus
402—Keypad
404—Graphical and/or Text Display
406—Handheld Unit
408—(Coaxial) Connector
410—(Coaxial) Cable
412—Unintended Emissions
414—(Coaxial) Connector
416—Antenna
418—Display
420—Instrument Panel
422—Hole in Instrument Panel Holding Equipment to be tested for RUL
424—Display from Circuitry Inside
426—PCB Board with Electronics Emitting Unintended Emissions
428—Equipment to be tested for RUL
430—(Coaxial) Connector
432—Antenna
434—(Coaxial) Cable
436—Detachable/Replaceable Antenna Assembly
438—Detachable Antenna
440—(Coaxial) Connector
442—(Coaxial) Connector 444—Spiral Highly Directional Antenna Element
446—(Coaxial) Cable
448—Detachable Spiral Antenna Assembly
450—Spiral Antenna attachable to Handheld Unit
500—Possible Embodiment of Unintended Emission Process or Board and Antenna
502—PCB Board Containing Emission Processing Chips
508—LNA
510—Splitter
512—Tuner
514—ADC
516—FPGA/CPU
518—RAM Memory
530—Display Controller
532—Keyboard Controller
538—EPROM/Program Memory
550—USB PHY
552—USB Connector
560—Power
570—Clock/Clock Dist
580—RF Connector—Female
582—RF Connector—Male
584—Unintended Emissions
586—Antenna
588—(Coaxial) Cable
600—Flowchart of Operations in Hardware and Software
602—Low Noise Amplifier
604—Hardware Elements
606—Tuner
608—Analog to Digital Converter
610—Digital Down Converter (DDC)
612—Cascade Integrator-Comb (CIC) Filter
614—Frequency Domain Fourier Transforms
616—Create Signature
618—Frequency Domain: pattern enhance, noise cancellation
620—Frequency Domain: integration across time and/or frequency bins
622—Wavelet De-Noise
624—Frequency Domain Signal Processing Pattern Recognition against known signature baseline pattern
626—Criteria Acceptance Determination and Outside World Communication
628—GUI and/or computer/DB
630—Software Elements
700—Spectrum
702—Center Peak
704—Phase Noise Attachment
706—Full-Width-Half-Maximum
708—Noise Floor of the Spectrum
710—Frequency Range
800—Spectrum Acquired from an DUT with Different Metrics Used for Determining RUL Detailed
802—Center Peak
804—Noise Floor
806—Peak Amplitude
808—Frequency Range
810—Peak Position
900—(unaged) DUT
902—(aged) DUT
904—(unaged)
906—(aged)
1000—Spectrum that Exhibits Cross Modulation Content/Amplitude Envelope of Peaks
1002—Center Peak
1004—Frequency Spacing between the Center Peak and each Subsequent Cross Modulation Product
1006—Cross Modulation Content/Amplitude Envelope of Peaks
1100—Electromagnetic spectrum showing the 15th harmonic
1102—Electromagnetic spectrum showing the region around the 16th harmonic
1104—The 18th harmonic peak, especially peak height characteristic for comparison with the 15th harmonic peak
1106—Frequency position of the higher order harmonics
1108—The 15th harmonic, especially the peak height characteristic for comparison with the 18th harmonic peak
1110—Frequency position of the higher order harmonics
1202—Handheld Emissions Diagnostic Unit
1204—Keypad
1206—Display
1208—Stand-alone Version of Handheld Emissions Diagnostic Unit
1210—Coaxial Connector or Wi-Fi Antenna
1212—(Coaxial) Cable
1214A—(Coaxial) Cable
1214B—Communication Cable
1214C—Communication Cable
1216—(Coaxial) Connector
1218—Antenna
1220—Instrument Panel or Dashboard Front
1222—Unintended Emission
1224—PCB Board with Electronics Emitting Unintended Emissions
1226—Equipment to be tested for RUL
1228—RF Processor Module
1230—Ethernet Connector
1232—Ethernet Connector
1234—Ethernet
1236—Wi-Fi Transceiver and Antenna
1240—Wi-Fi to/from Device Being Examined
1242—Wi-Fi to/from Handheld Unit
1300—Navigation unit
1302—Instrument Panel or Dashboard
1304—Instrument, for example such as Navigation Unit/Voice Communication Transceiver
1305—RF emissions from instrument 1304
1306—RF Emissions
130A—RF Emissions
1308, 1308A—Other Instruments Behind Instrument Panel or Dashboard
1310—Antenna behind Instrument Panel or Dashboard
1312—(Coaxial) Cable behind Instrument Panel or Dashboard
1314—RF Processor Module behind Instrument Panel or Dashboard
1316—Connector on Instrument Panel or Dashboard
1410—Opened LRU or Chassis Containing Computer/Logic Cards
1412—Chassis
1414—Logic Card
1416—Placement or Removal of Card
1418—Antenna
1419—Unintended Emissions Processing Board
1420—Unintended Emission
1422—Communication Cable
1430—Chassis
1432—Chassis Lid
1433—Unintended Emission
1434—Window Transparent to RF
1436—Emissions Processing Module and/or Antenna
1438—Communications and/or Coaxial Cable 1440—Closed Chassis Containing Operating Computer Cards
1442—Integrated Antenna and/or Emissions Processing Module
1444—Communications and/or Coaxial Cable

DETAILED DESCRIPTION OF EXEMPLARY EMBODIMENTS

Prior to proceeding to the more detailed description of the claimed subject matter it should be noted that, for the sake of clarity and understanding, identical components which have identical functions have been identified with identical reference numerals throughout the several views illustrated in the drawing figures.

The following detailed description is merely exemplary in nature and is not intended to limit the described examples or the application and uses of the described examples. As used herein, the words "example", "exemplary" or "illustrative" mean "serving as an example, instance, or illustration." Any implementation described herein as "example", "exemplary" or "illustrative" is not necessarily to be construed as preferred or advantageous over other implementations. All of the implementations described below can be exemplary implementations provided to enable persons skilled in the art to make or use the embodiments of the disclosure and can be not intended to limit the scope of the disclosure, which is defined by the claims.

Furthermore, there is no intention to be bound by any expressed or implied theory presented in the preceding technical field, background, or the following detailed description. It is also to be understood that the specific devices and processes illustrated in the attached drawings, and described in the following specification, can be simply examples of the inventive concepts defined in the appended claims. Hence, specific dimensions and other physical characteristics relating to the examples disclosed herein are not to be considered as limiting, unless the claims expressly state otherwise.

The terms and words used in the following description and claims can be not limited to the bibliographical meanings, but, can be merely used by the inventor to enable a clear and consistent understanding of the subject matter. Accordingly, it should be apparent to those skilled in the art that the following description of exemplary embodiments of the subject matter can be provided for illustration purpose only and not for the purpose of limiting the subject matter as defined by the appended claims and their equivalents.

It is to be understood that the singular forms "a," "an," and "the" include plural referents unless the context clearly dictates otherwise. Thus, for example, reference to "a circuit board" includes reference to one or more of such circuit board.

It is to be understood that terms such as "electrically powered device", "electrically powered part" or "electrically powered component", "electrically powered equipment" includes, without limitations, an Integrated Circuit (IC) chip, FPGA, Application Specific Integrated Circuit (ASIC), partially or fully assembled circuit board, an instrument indicating a condition/state of a device, a sub-system of components, a plurality of circuit board assemblies installed in a chassis, an enclosure or in a rack, a computer system, a computer peripheral or considered to be a pattern in computer memory. For the sake of simplicity, the following description will refer to a device or a device under test DUT).

It is to be understood that a good device can be a known good part, or can be a device containing known good software, firmware or hardware with significant RUL. Term "good" implies compliance with any one of manufacturer specification, industry standard, military standard, inspection protocol, quality control protocol, with RUL levels sufficient to perform an intended function. Further, it is to be understood that a candidate device is an electrical or electronic device with unknown RUL.

The particular embodiments of the present disclosure generally provide apparatuses and methods to at least screen, detect, and estimate RUL of device(s), which currently rely on time intensive manual maintenance procedures or time-of-operation logging.

In particular embodiments, such device is an instrument panel assembly.

In particular embodiments, the apparatus is provided as a separate, isolated, portable, unobtrusive, non-contact, and/or attachment-free and handheld apparatus that is configured to inspect device(s) to determine RUL.

In particular embodiments, a non-destructive assessment of the internal circuitry of device(s) is achieved through analysis of their unintended radiated emissions, providing sensitivity to minute alterations to the functionality of sub-components inside these complex devices. These alterations can be induced by aging of the device(s) incurred after significant number hours of operational use or single-event upsets, whereby the device(s) deviate(s) from normal functionality as part of a random failure event.

In particular embodiments, analysis of unintended radiated emissions results in detection, classification of aging, and prognostics of RUL that each manifest from hardware changes, hours of operation, or out-of-specification device (s) from the original manufacturer or that were accidently or intentionally emplaced either by the original manufacturer or a third party.

In particular embodiments, analysis of unintended radiated emissions results in the automated detection, location and, disqualification of device(s) that may be subject to an unacceptable likelihood of failure prior to, during testing, or after their integration into critical systems.

In particular embodiments, the size and weight of the hand-held apparatus is defined to be weighing less than 2.3 kg and of size dimensions less than or equal to 255 mm long, 125 mm wide, and 100 mm high, as defined by the FAA Human Factors Group publication entitled "Human Factors Guidance for the Use of Handheld, Portable, and Wearable Computing Devices"

In particular embodiments, the apparatus and method are provided for screening and inspecting electronics for performance changes in electrically powered components. The apparatus includes a sensitive unintended electromagnetic energy collection sensor, a controller with one or more processors processing algorithms or executable instructions to compare signatures of the collected energy from the device(s) under test to a known standard, standard of comparison, or to a predetermined understanding of expected emissions of the inspected object and at least one specifically created algorithm or executable instructions for automatically determining if the signature of the collected electromagnetic energy matches the standard, which may define presence of device(s) showing characteristics of impending failure.

Every electrically powered device gives off electromagnetic emissions when operating or when being simply in a powered state where the electric energy from an energy source is connected to various circuits and/or components within such electrically powered device. When the device is simply powered on, the electromagnetic energy emanates from any one of wires, inter-component connections, and junctions within the electronic device. Exemplary embodiments operate by analyzing the unintended and/or intended emissions of the electronic device.

The forgoing description will be focused on emission(s) of electromagnetic energy and, more particularly, the emission(s) of electromagnetic energy being in a Radio Frequency (RF) spectrum, which is typically referred to in the art as frequencies above 3 kHz and below 300 GHZ, although infrared, infrasonic, and other emissions can be also contemplated by the exemplary embodiments. The forgoing description will be further focused on intended and unintended features of intended emission(s) of electromagnetic energy.

In this document, unintended emission(s) can be considered herein to be not only emissions emitted unintentionally by the device contrary to the intent and objective of the device, system, or its designers, but also unintended properties of intended emissions of the device. Term "unintended emissions" can refer to electromagnetic energy that is captured and analyzed and which is not directly produced by the intended functionality of the device. A non-limiting example of the unintended emissions may be electromagnetic energy that radiates from wires and/or connection nodes when the device is simply powered ON. Conversely, term "intended emissions" refers to electromagnetic energy that is captured and analyzed by the apparatus which is a direct result of the intended functionality of the device, such as for example the carrier signal of an FM transmitter. Therefore, the intended digital data contained in an intended digital transmission would not be considered unintended, however other aspects of the intended signal such as harmonics, phase noise, frequency stability, out-of-band signal content, amplitude deviation, bit duration times, etc. could be deliberately used by the system for information content to be conveyed to the user.

Emissions phenomenology, especially unintended emissions, can be causally dependent on its internal circuitry, and can manifest as well-defined signatures, in the time domain, frequency domain, or both, that can be classified by identifying characteristic signature parameters and metrics associated with altered or additional functionality. Here, functionality is described as the current working condition of the device, and can be referred to as operational, aged to a degree, likely to imminently fail, or beyond useful life. "Operational" here means that the device is in full specified working order, with no functional hardware flaws and fully functioning subcomponents. "Altered" or "additional" functionality refers to deviations from operational status that damage, degrade, or otherwise change the performance of the electronic device.

Signature element metrics that are analyzed may include, but not be limited to the type illustrated in FIGS. 7-11. More particularly, such signature element metrics can include frequency, wavelength, amplitude, phase, peak width, Full-Width-Half-Maximum (FWHM), harmonic indices, harmonic spacing and peak position, peak skewness, cross modulation peak characteristics, and magnitude of the noise floor, and power differences between peaks.

This approach bears several potential advantages, namely passive, non-contact scan of the electronic device, for example being under test, completely non-destructive and poses no hazard to operators or environment. The example device(s) under test can be also tested while integrated into their operational environment, for example such as an aircraft cockpit. Such rapid test approach may enable screening of 100% of devices prior or during flight operations, preventing any possible failure and potential crash or loss of life, it can continuously monitor and test the electronic device and even a system employing such electronic device while it is usefully and functionally operating, without interfering in any way with the normal operation. This approach can virtually immediately detect equipment degradation status in any one of the following conditions: while it is being used in flight, is fully operational, and/or before it can cause malfunction, loss or damage. Supervisory systems, circuitry and/or separate software designed for this purpose, upon detection, can be notified of a new, attempted, ongoing or sudden degradation or partial degradation and thus allow corrective action to be taken that may include any one of a switchover to an isolated redundant backup system, disconnection of device, placing the electronic device and/or its system in a non-operational state to prevent damage of other equipment or other loss, notifying personnel, quarantine of the electronic device and/or its system to prevent incorrect communications, control or actuation, disabling external access to the electronic device and/or system to prevent unwanted external access to a device, and/or other appropriate, necessary or desirable actions. A signal, voltage state value, watchdog periodic signal, or the like can be transmitted to notify external equipment or personnel of the continuous, periodic, sporadic or occasional monitored equipment status. Further, an external RF transmission can be transmitted, either manually or automatically, to the device to disrupt, disable or change state of the device such as from automatic to manual operation.

It should be noted that although the emission acquisition means is typically an external antenna integrated into a handheld all-inclusive antenna-RF-acquisition-processing-Human-machine-interface unit, or similar RF emission acquisition means integrated into and comprising the subject matter that may be of a wideband antenna type, emission features or emissions especially in the RF range coupled into the devices' normal signal line circuitry may be similarly acquired through appropriate capacitive, inductive or direct coupling means to I/O lines of the electronic device without interfering in any way with normal operation.

In an embodiment, a discernment of a degraded condition between an unknown degradation condition device and a known new and good device with and without active use within an aircraft can be based solely on unintended emission signatures and identified characteristic signature elements associated with different categories of part, boards, subsystems, or components and algorithmic method for detecting device degradation in emission signatures for a relevant device, is presented.

In an embodiment, a method provides for automatically detecting and classifying degradation or imminent failure in the device through unintended emissions. Characteristic emission signature elements associated with different equipment can be identified using at least an algorithmic methodology for detecting these elements. Algorithms targeting aging or degradation phenomenology can be embedded within the electronic assessment sensing technologies for the purpose of an exemplar embodiment though other embodiments can be clearly possible. Automated detection of aging or degradation in the devices based on unintended emission phenomenology is an exemplar embodiment. Automated alarming or corrective measures can be readily integrated with degradation detection capabilities for full automation of the technology, reducing operating expenses by minimizing labor hours needed to perform screening and has been clearly envisioned and contemplated here within. The capabilities disclosed herein have a broad impact across domestic industries in ensuring continued operation of safety-critical equipment and technology and their operations by enabling rapid detection of hardware failure onset or degradation and for technology users to be able to validate the technology operation and prediction and its RUL that is used on a day to day basis.

In an embodiment, there is provided a disruptive technological capability in at least minimizing if not completely preventing the unnecessary replacement of the device. The capability greatly increases critical system availability, safety, maintenance certainty, and reducing Device cost.

In an embodiment, there is provided a disruptive technological capability to optimize allocation and minimize replacement costs of replacing or retiring/discarding aged components, boards, complete device, or subsystems among a group of device. Thus a board can be determined to have a 5 year RUL and can be placed in a device whose other parts or subsystems similarly have been sensed by this subject matter to have a 5 year RUL. In this way the system will maintain the same level of degradation and when retired, approximately all replaceable components, parts, modules, boards or sub-systems will be at the same level of degradation, that is, no 'value' or valuable RUL will remain and be wastefully discarded in any scrapped device(s). This capability includes enabling an intelligent means such as an AI system and device database containing known aging levels or RUL of devices and their constituent parts, RUL discerned by this subject matter to optimally schedule and distribute spares or parts between and within the device(s).

In an embodiment, the apparatus is configured as a screening tool for detecting economic value of used equipment through its estimated RUL and estimated equipment value. A simple formula may be usefully employed to calculate dollar value of equipment based on % RUL remaining multiplied by Equipment Cost. This screening tool can be applied at multiple stages during lifecycle of the electronic devices, from device fabrication through board level integration and following routine maintenance. The screening tool is automated such that an untrained technician can successfully screen for degraded device or determine RUL of the device, by only initiating operation of the screening tool. Additionally, such a technician may screen for the level of economic value of the device, accumulating the information in a database or immediately deciding to acquire, set aside, store, repair, replace or discard the device at that time or at a later point in time. Business metrics may automatically provide a value threshold or RUL threshold or range for the above categories, or a web based bidding system may be automatically employed.

In an embodiment, a methodology and hardware/firmware test system detects degraded device or RUL of the device, offering sensitivity to perform 100% inspection for critical applications, and real world applicability and a rapid, non-destructive test method that can be fully automated for routine detection and disqualification, categorization, or valuation of device. The subject matter may also be used to determine make, model, serial number, software version number, software revision, firmware revision, hardware version, or related information of the DUT, or of its constituent components. This may ensure proper version compatibility or functional interoperability of various subsystems or software within a device.

In an embodiment, therein is provided a rapid, non-destructive test method that can be fully automated for routine detection, evaluation, ranking, monetary valuation and/or disqualification of device.

All aspects of a circuit, for example such as integrated circuit (IC) affect the waveform emitted as power percolates through active and inactive sections of the IC. The resulting emission spectrum serves as a fingerprint that can be used for determining degradation, aging, degraded or inoperable parts, boards, components, connectors or subsystems diagnosis and/or identification for rapid troubleshooting of degraded or inoperable parts, boards, components, connectors or subsystems, total operation time and Remaining Useful Life diagnostics. Of degraded or inoperable parts, boards, components, connectors or subsystems manifest in the measured emission spectrum. This phenomenology may also be used simultaneously to screen software, firmware or hardware components of systems differentiating proper operation from malware infested components/boards/subsystems/systems, containing counterfeit and/or recycled components, recycled boards, sporadically faulty hardware, and/or intermittently operational Device in a rapid test typically requiring approximately 3 seconds per system on average. The algorithmic approach, executed by control device(s), for example such as a microprocessor-based controller, leverages this phenomenology to determine whether unacceptable operational anomalies can be present in the device(s) or if similar operational defects or operational problems can be present.

In an embodiment, therein is provided a novel means for rapidly and reliably detecting device defects which can be typically in a single IC component, board, module, subsystem or system and their detection will invoke appropriate corrective measures. Location of the defect is also encompassed in some embodiments of this disclosure.

Analysis of unplanned emission artifacts can provide an indirect and potentially non-contact method for examining the inner workings of an IC without the need for destructive or costly full electrical test techniques. Changes to the internal circuitry of the IC affect current flow when IC is powered and thereby alter the emitted waveform from the IC. This phenomenological relationship can be used to detect these changes and identify whether a received unplanned emission artifacts is clean or whether problematic circuitry exists.

Detection can be achieved by supplying power, to a device, subsystem or system under test, capturing the resulting unplanned emission artifacts, and algorithmically analyzing by control device(s), for example such as a microprocessor-based controller, the emission spectrum so as to identify characteristic signature elements of such spectrum. Alternatively, capturing of the emissions of a self-contained system can be done in-situ, already powered and operational, near-field or far-field. During operation, the device can typically be more optimally placed into an enclosure which isolates device emissions from radiative environmental sources (>80 dB isolation and typically with a sensitivity greater than −150 dBm) with example embodiments providing sensitivity of −160 dBm, −170 dBm, and −172 dBm. Alternatively, during operation of the device(s) under test, such device(s) can be adjacent an enclosure which isolates device(s) emissions from other device or radiative environmental sources (>20 dB isolation and typically with a sensitivity greater than −150 dBm) with example embodiments providing sensitivity of −160 dBm, −170 dBm and −172 dBm. In some embodiments, the device may incorporate a portable electromagnetic shield enclosure, typically of an electrically conductive material, said enclosure typically open or adaptable to substantially accept emissions from the device under test (DUT) while simultaneously shielding or rejecting RF emissions and/or RF noise from other electronics devices not being examined at that time or from general environmental noise.

The unanticipated RF Emission artifacts phenomenology used has a thoroughly established foundation in electrodynamics. Current flow through internal circuitry, specifically changes in electron current in conductors produce radiated emissions that can be dependent upon path length, geometry, and the electrical properties of the circuitry used (trace resistivity, dopant levels, etc.). Software algorithms and/or executable instructions perform an algorithmic analysis on emission signatures to automatically, without user intervention, identify acquired key signature elements which then can be analyzed or automatically compared to assess state and/or condition of the internal circuitry of the device being tested.

Emission signature elements, that are characteristic of operationally aged altered devices and signature content that manifests due to the presence of RF frequency (typically in Mhz real numbers) vs. RF signal strength (typically in relative dB or absolute dBm) and optionally also in phase (typically in degrees or radians) and also optionally also relative to other emissions or emission harmonics patterns, can be acquired and analyzed. Algorithms and/or instructions can be executed by one or more processors to extract signature elements in locations that can be specifically associated with the device degradation or key device processing operations such as transmitter signal amplification or pitot tube sensor front-end signal conditioning, flagging the device degradation as unacceptable and/or identifying the degradation, anomaly, degree of degradation, and/or degree of anomaly present. The scoring of the degree of degradation, and/or degree of anomaly present may be in time period of average RUL, standard deviations from normal operation, percentile of degradation in devices considered substantially functional, or other numerically categorized or classified means. The device(s) can then be manually or automatically quarantined prior to disposal, repair or replacement.

The sensitive unintended electromagnetic energy collection apparatus could be any means known in the art for collecting electromagnetic energy.

In one embodiment, a highly sensitive Radio Frequency (RF) energy collection apparatus, including at least a receiver coupled to an antenna, and a signature measurement and comparison means, for example such as a microprocessor based controller, can be used for collecting emitted electromagnetic energy and processing and comparing signature of the collected electromagnetic energy to a known standard and where RF is defined as covering the frequency range from about 16 KHz to about 300 GHz.

The described techniques can be applied, in addition to the RF emissions, to higher frequency or shorter wavelength emissions, for example such as infrared spectrum analysis. In one example, some devices may unduly draw excess current causing excess heat to be radiated from a portion of a circuit or chip. This energy can be captured, measured and analyzed. In another example, temperature of the device may be reduced as a result of a cooling spray such as or similar to a refrigerant, causing a change in emissions from the device which is then compared to a previously acquired emissions change from a known good exemplary device, which may be substantially considered new or of maximum RUL.

Radiated emissions, may be targeted in a non-contact, non-destructive, and fast enough manner enabling the inspection of all material (100% screening) intended for critical applications. These emissions can be analyzed to conceptually provide a fingerprint or fingerprints of what is anticipated and hence form a pattern or patterns. These patterns can be tracked, monitored and verified to be certain to a degree of probability or alternatively a quantified score that the hardware has not substantially different aging and has sufficient RUL.

The subject matter may often differ from conventional approaches by way of typically leaving the device in place since one exemplary approach disclosed herein uses constructed shield to maximally shield unwanted RF external emissions from sources other than the DUT and maximally receive wanted RF emissions from the DUT source and maximally receive emissions or changes in subtle emissions derived from the interactions of the electrons with the physical electronics while the DUT electronics while it is functionally executing the signals, firmware or hardware, said emissions derived from aging changes being detectably discerned.

The energized and powered device that is being tested, inspected and/or interrogated directly or indirectly may provide a mechanism for transmission of the energy that is being radiated which is governed by the internal design of the device being inspected. Typically, the source that powers the device is the energy which powers the electronics though as noted it can be an oscillating signal such as a clock, clock signal, signal, frequency input, frequency reference, signal generator, frequency generator or other oscillating sources that can be known in the art. A mechanism that transfers the energy to a radiating element within the device being tested, inspected and/or interrogated can be integrated circuit dies, wire bonds, semiconductor traces, board traces, wires, cables or structural capacitive or inductive coupling. The radiating element may be an intendedly radiating antenna or an unintended antenna that due to physical dimensions acts as a reasonable antenna. As the internal parts of the device(s) (whether it is a discrete semiconductor, integrated circuit, printed circuit board, circuit board assembly, system, subsystem) age, they gradually emit a different electromagnetic signature and can be differentiated from unaged discrete semiconductor, integrated circuit, printed circuit board, circuit board assembly, system, sub-system for inspection or screening purposes.

In an embodiment, an apparatus or method can be configured to screen, detect, and disqualify device replacement boards, modules or components containing excessively aged regions, ICs, boards, modules or chips to protect the reliability of critical systems which rely on complex ICs. These potentially over-aged, faulty, degraded, inoperable, marginally operable devices can include FPGAs, Complex Programmable Logic Devices (CPLDs), microprocessors, microcontrollers, Digital Signal Processing (DSP) chips, Power PCs, System on a Chip (SoC) architectures, etc. Automated algorithmic assessment and signature comparisons of unintended emissions from these devices as well as fully integrated boards, systems or computer assets that contain these components may be carried out in the subject matter described herein. Comparisons with previously or simultaneously acquired known good emissions from known good software, firmware or devices operating in known good hardware can be typically employed. Simultaneous or substantially simultaneous comparisons can be acquired by the use of two or multiple subject matter devices in communication with each other, simultaneously comparing RF emissions acquired from DUTs and exchanging results of acquired emissions with each other. In this case, typically one of the DUTs would be a known good device.

Automated, i.e. without user actions during test execution, detection of the device anomalies based on unintended emission phenomenology is another exemplar embodiment. The device may be robotically manipulated, located, and/or oriented for maximum emission signal strength reception, and/or positioned to take measurements, requiring little or no user intervention or operation.

Automated periodic retesting can readily be integrated with the detection capabilities for full automation of the technology, reducing operating expenses by minimizing labor hours needed to perform screening manually and has been clearly envisioned and contemplated here within. The developed capabilities may have a broad impact across domestic industries in reducing unnecessary replacement costs and their operations impact by enabling rapid detection of degradation threshold onset and for aircraft users to be able to validate the technology that is used on a day to day basis.

An exemplary embodiment employs a handheld apparatus. A robotically manipulated, moved, placed on or near devices to be tested and automatically acquire RULs of these devices within a cockpit, airplane or between a number of planes is also contemplated herein.

Similarly, a consistent difference in acquired spectrum at the same frequency, span and RBW between a good device and an unknown device, and/or that is a change in amplitude from new devices to a degraded device, may lend evidence of functional degradation in an unknown device. This same principle may apply to any spectral regions illustrating evident differences, such as those shown in FIG. 7 or changes to metrics illustrated in FIGS. 9 and 10, including frequency, wavelength, amplitude, phase, peak width, Full-Width-Half-Maximum (FWHM), harmonic indices, harmonic spacing and peak position.

It can be further recognized that continuously and/or commonly appearing peaks or characteristic features evident in the frequency domain can be acquired and subtracted out as a preprocessing step to further enhance and better reduce the influence of constant unrelated signals when creating or comparing signatures. Additionally, the use of non-coherent integration can reduce the unwanted noise present and enhance the features' characteristics and pattern resolution. The employed hardware components can provide sufficient speed of data collection processing and throughput to extract significant information from the DUT. For example, emissions from the navigation computer in an aircraft cockpit or a ship control bridge can be exploited for detection of aging.

There can be typically at least several exemplary modes of operation. In the signature acquisition mode, the characteristics of frequency regions containing emission signature features/elements specific indicating RUL or level of degradation in a system or a device may be found and acquired by both the antenna and the receiver coupled to the antenna. Alternatively, in the same basic signature acquisition mode, the signature characteristics of frequency regions apparently containing features specific to a known new device operating in a system or a device may be found and acquired. The signature acquisition mode can search for and find all candidate signature regions which exhibit a characteristic group of complex peak structures. These candidate signature regions can later be compared, by software and/or executable instructions, with candidate signature regions emitted from known new or known degraded devices. The comparison yields signature regions which can be common to both and also those of the same frequency which indicate no common relevant emissions to be compared, such as an arbitrary noise generator device in some frequency regions, and also signature regions which can be present, absent, or modified in only the exemplary devices and indicative of a basis for comparison and discriminating factor which can be used to weigh, compare, evaluate, or identify the device from its RF emissions.

In an embodiment, the signature acquisition mode can obtain signature frequency regions from an antenna located in an anechoic RF isolating chamber, an antenna located on or near a board under test being assembled, or an antenna located outside or inside a complete system under test, for example such as a navigation system inside the aircraft cockpit. Further, signature acquisition modes can include a means to acquire the exemplary signatures for the device by simply powering it and allowing an onboard built-in clock within the device to run the device, generating the characteristic RF signatures within the exhibiting frequency regions.

Alternatively, the signature acquisition mode can include a means such as an external means such as an IC clip (attached to exemplary unintended signal EMI sources such as power, ground or exemplary I/O signals) to clip onto an IC in the DUT to induce generation of the exemplary signatures for a device, chip, or subsystem by providing it both an external clock and a power source while the characteristic signature feature search and acquisition is occurring. In an embodiment, there may incorporate a means to power and generate appropriate signals including clock signal within an anechoic chamber (not shown). In an embodiment, there may be a means to deliberately age a known specific exemplary configuration into the device, chip, or board under test to acquire the exemplary aged signature after the device has run for a significant time period and typically before it is aged to failure. Furthermore, additional stresses may be applied to the device being aged, such as higher or lower than normal temperature, power spikes, temperature gradient, electrical noise, electrical signal, humidity, pressure, voltage input, vibration, G forces, or similar stresses. In an embodiment, there may be a means to exercise the board under test using driven controlled outputs for use as device or board's inputs to invoke a state which triggers or better invokes exhibits or exercises the degradation and creation of degraded signature characteristics. The degradation characteristics may only exhibit highly recognizable signature behavior patterns periodically, sporadically, occasionally, conditionally and therefore a means to trigger such behavior, such as deliberately causing a state in the system or device, or performing an action other I/O operation, or operation mode selection may be contemplated here within.

The signature comparison mode may search for and obtain signature frequency regions from an antenna located in virtually unlimited possible number of antenna configurations and compares the signatures acquired with the characteristics of known good or bad software implementations running in the hardware under test. The antenna configuration, orientation, polarization, location, gain, or other characteristics may be measured, established and/or manipulated to acquire emission characteristics under these differing antenna configurations. A non-limiting example nay provide for rotating the antenna 5 degrees along an axis and moving it in one spatial direction 10 mm and obtaining a new set of data to be analyzed or converted into a signature for that new specific location—to be later compared with signatures obtained from other DUT devices with acquisition antenna similarly or identically configured.

Though one embodiment focuses on emissions from about 16 KHz to about 300 GHZ, the bandwidth can be reduced to about 30 MHz to about 1 GHz to capture the majority of emissions from DUTs. Characterization of the device, in one embodiment, may be performed over the 3 kHz-300 GHz frequency range/spectrum, in any of the increments, with high spectral resolution (low resolution bandwidth (RBW)) to maximize Signal-to-Noise Ratio (SNR). Other embodiments may allow measurements from 1 GHz to 10 GHz, 10 GHz to 100 GHz, 100 GHz to 300 GHZ, 1 kHz to 1 MHz or the complete range from 3 KHz through 300 GHz most of which is often defined as the Radio Frequency (RF) band. Data acquisition can be controlled via the software or executable instructions, enabling full capture of broadband signal information in a reasonable time frame. Specific regions of interest as candidate signature regions identified in broadband sweeps of the frequency range/spectrum, can be closely examined using software algorithms for the presence of peaks and especially peaks indicating intermodulation components. Real-time assessment enables capture of multiple looks to identify any variability in signature due to random noise fluctuations and is critical in capturing time-varying content within signatures.

Emission signatures within the any increment of the frequency range/spectrum can be analyzed to identify signature elements characteristic to Device categories such as communication devices as typically indicated by one means as an increase or decrease in noise floor emitted or in phase noise of emitted peaks. Signatures for unaltered or known Device boards may provide a baseline to expedite comparison with known aged, faulty or degraded boards and identification of aged, faulty or degradation signature characteristics.

The presence of the anomaly manifests in the emission signature in at least one of alteration of signature elements when compared with an associated exemplary device, inclusion of additional signature elements and removal of signature elements seen in the baseline. Examined emission signature characteristics may include, but not being limited to, spontaneous emission phenomenology, non-linear mixing products, phase noise, signal to noise ratio, and noise level.

Now in a reference to FIG. 1, therein is illustrated an exemplary apparatus, generally designated as 104, configured in a hand-held form factor and operable to monitor, detect and/or differentiate between properly operating, unaged device(s), and aged or degraded versions of the same electrical device(s).

Figure 3:
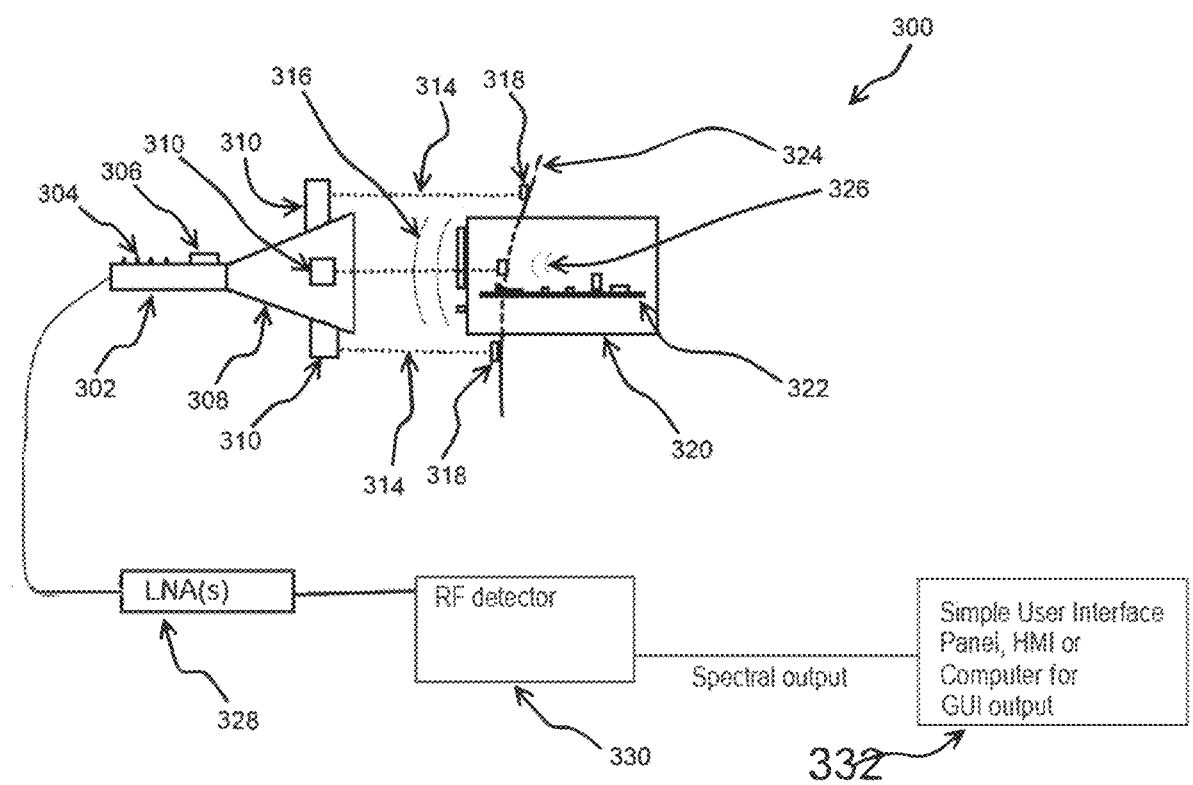
FIG. 3 illustrates an exemplary embodiment of a hand-held apparatus for testing electrical or electronic device(s) with an exemplary placement position of the apparatus in a relationship to device(s) to be tested.

In FIG. 1, the apparatus 104 is shown as operating in an exemplary environment, acquiring emissions 106 from a DUT 110 that is part of a complete and populated instrument panel 102 with other electrical devices 114 which may similarly be tested. The instrument panel 102 can be of the type as found in an aircraft, ship, train, automobile and the like applications. Herein, each of the DUT 110 and the unexamined device 114 can be either operational, aged to a degree, likely to imminently fail, failed, or beyond useful life. In the embodiment illustrated in FIG. 1 the handheld apparatus 104 comprises a housing 105, a display 105A and a user interface 105B that can be a simple ON/OFF switch. The apparatus 104 can also comprise an antenna, a receiver and a controller in an accordance with the embodiments of FIGS. 5-6 that are mounted within the hollow housing 105. The apparatus 104 is also illustrated with an optional shield 112 attached to the housing 105. The function of the shield 112 can be two-fold. The shield 112 can provide a method of eliminating unwanted emissions 108 emanating from unexamined device 114, while the apparatus 104 receives emissions 106 from the DUT 110. The shield 112 can also provide a physical stand-off mechanism that allows the hand-held apparatus 104 to be placed in a consistent, registered location relative to the DUT 110. This physical registration mechanism allows the apparatus 104 to be placed in the same physical location relative to the DUT 110 for multiple measurements, either repeated in succession or performed at future times. The apparatus 104 can also include a registration mechanism that can includes a laser rangefinder used, for example, to measure the distance from the DUT 110, which ensures that the measurement can be repeated from the same location relative to the DUT 100. The laser rangefinder embodiment is best illustrated in FIG. 3.

The shield 112 can also be capacitively coupled or attached to the instrument panel 102 which acts as a ground and thus grounded to form a more effective shield.

One exemplary embodiment may include use of a RF shielding enclosure, partly shielded enclosure fitting over a device under test wherein the unshielded area is configured to couple with the DUT case shielding the device from external noise, or an anechoic chamber for enhanced low level signal sensitivity. One exemplary embodiment may be designed for use in noisy environments by additional filtering and noise reduction means such as non-coherent integration. One exemplary embodiment may contain all of the above features, while other embodiments may contain a limited subset or only one of the capabilities described above or below. All exemplary embodiments contain the necessary emission acquisition means, hardware processing means, software processing means, and result actions means needed to determine if a device has aged beyond a safe operating margin, that is too close to an impending failure.

Furthermore, additional control device samples may typically be used and kept separate from DUT 110 whenever possible. These control device samples may be used as system calibration specimens during the electromagnetic emission analysis process. When inspecting a large aircraft with many installed devices, such as a commercial jetliner, and focusing on a specific DUT 110, areas that can be not under examination may be masked with appropriate shielding. Appropriate shielding may be attached to the DUT 110, free standing on the cockpit floor (not shown), or attached to the equipment panel so the weight of the shielding does not dislodge easily.

Figure 2:
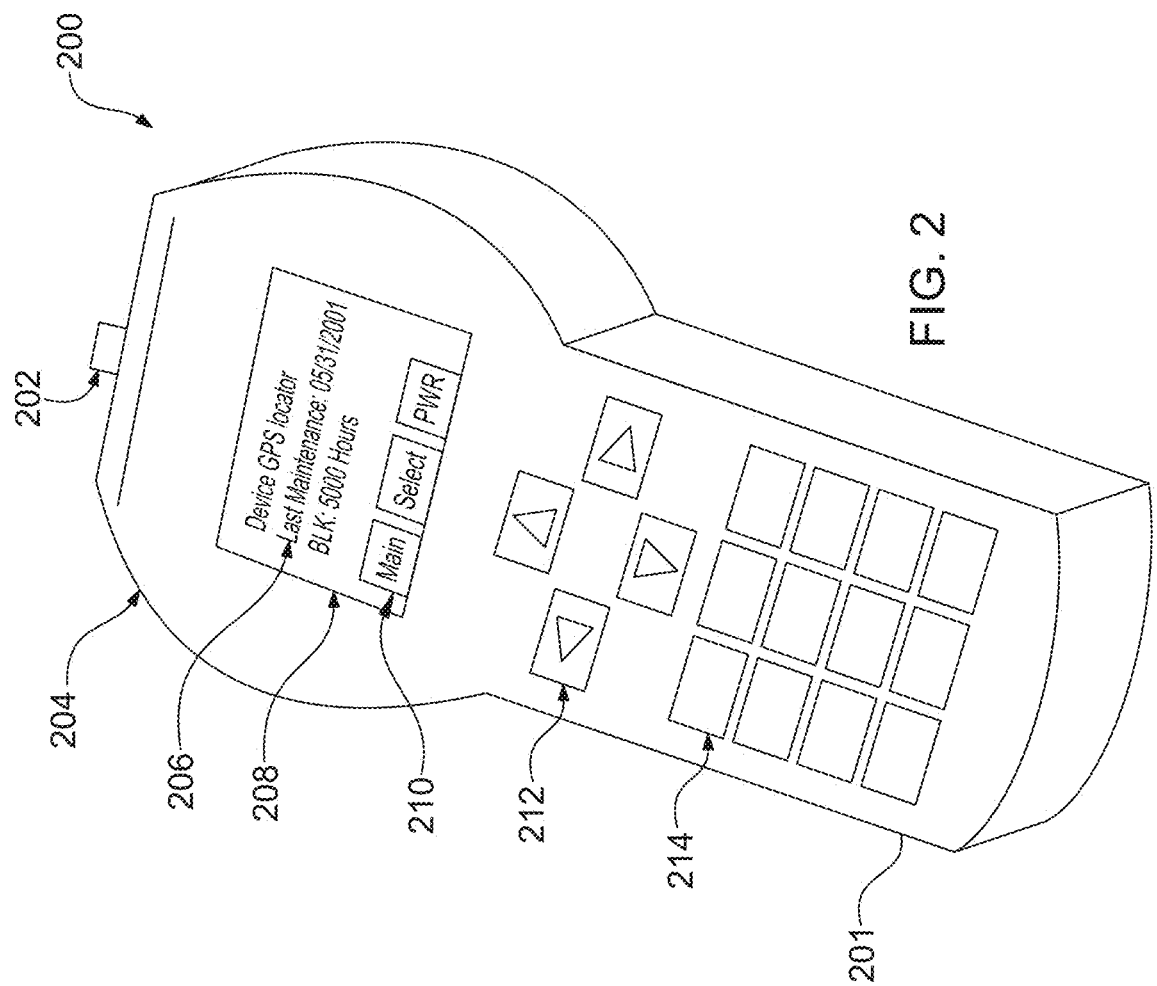
FIG. 2 illustrates an exemplary embodiment of a hand-held apparatus for testing electrical or electronic device(s), particularly illustrating a graphical user interface and a keypad.

FIG. 2 illustrates another exemplary embodiment of a hand-held apparatus. In this embodiment, a hand-held apparatus 200 comprises a housing 201 and a graphical user interface (GUI) 206 which can be configured to display exemplary data and information reported in human readable format. Example data shown in the graphical interface can include any one of the specific name of the DUT 100 ("GPS Receiver"), the last date on which the previous measurement was acquired and the RUL result obtained from measuring and analyzing emissions from the DUT 110. The embodiment shown in FIG. 2 also includes a key-pad 214, arrow keys 212 and interactive menus 210 that can be accessed and scrolled through using the arrow keys 212 and key-pad 214 to, for example, select specific detailed RUL results from different specific spectral regions and signatures and hence known different electronic components within an overall DUT 110. Data acquired from and reported by the apparatus 200 can also be reported in a machine-readable format. The GUI 206 may be in a communication with one or both time domain and frequency domain processing modules or controllers of FIGS. 5-6.

The apparatus 200 is also shown in FIG. 2 as comprising a connector 202 at one end of the housing 201. The connector 202 is configured to couple/attach interchangeable antennas in order to collect/capture RF emissions. Herein, interchangeable antennas refer to separate antennas that can be connected and disconnected at will from the hand-held apparatus 204 via an RF cable. This connector 202 may be any one of the SMA-type, N-type, BNC-type, or other commonly used RF connection modality. From a hardware perspective, the apparatus 200 is agnostic to the antenna connected to the connector 202. Such suitable RF antenna may of sufficiently light weight and size as to attach directly to the front of the apparatus, be a floor-mounted antenna such as a log-periodic antenna, be a horn antenna, a conformal antenna, a spiral antenna, or be integrated in situ with an electrical device under test and accessible via appropriate RF connection.

FIG. 3 illustrates another exemplary embodiment of a hand-held apparatus. In this embodiment, a hand-held apparatus 300 can be configured to capture RF emissions 316 emitted external to the DUT 320. The embodiment shown in FIG. 3 can use a hand-held apparatus 300, constructed similarly to the apparatus of FIG. 1 or FIG. 2. The hand-held apparatus 300 is illustrated as comprising a housing 302, a keypad 304, a graphical display 306, and a member 308. The member 308 can be a shield, for example such as the shield 112 of FIG. 1. The member 308 can be a horn-shaped antenna coupled to the housing 302, for example by way of a connector 202 of FIG. 2. It is also contemplated herein that the DUT 320 can comprise internal subcomponents 322 that emanate emissions 326 within the interior of the DUT 320, as well as contribute to emissions 316 measured external to the DUT 320. The external RF emissions 316 are collected and analyzed by the apparatus 300. Such RF emissions 316 can be an unintended emitted electromagnetic energy and/or intended radiated energy from the DUT 320. An exemplary RF hardware chain for the apparatus 300 is being illustrated as consisting of a low noise amplifier (LNA) 328, RF detector 330, and a graphical user interface (GUI) 332. When the apparatus 300 is configured to capture RF emissions 316 from the DUT 320, the apparatus 300 can comprise the LNA 328, and the RF detector 330 that may consist of a tuner and analog to digital converter (ADC), and the GUI 332. The acquired emissions 316 from the DUT 320 are amplified by the LNA 328. The combination RF shield/antenna horn suppresses external, unwanted noise features and to amplifies thru antenna gain the low-intensity emissions signatures from the DUT 320.

Figure 5:
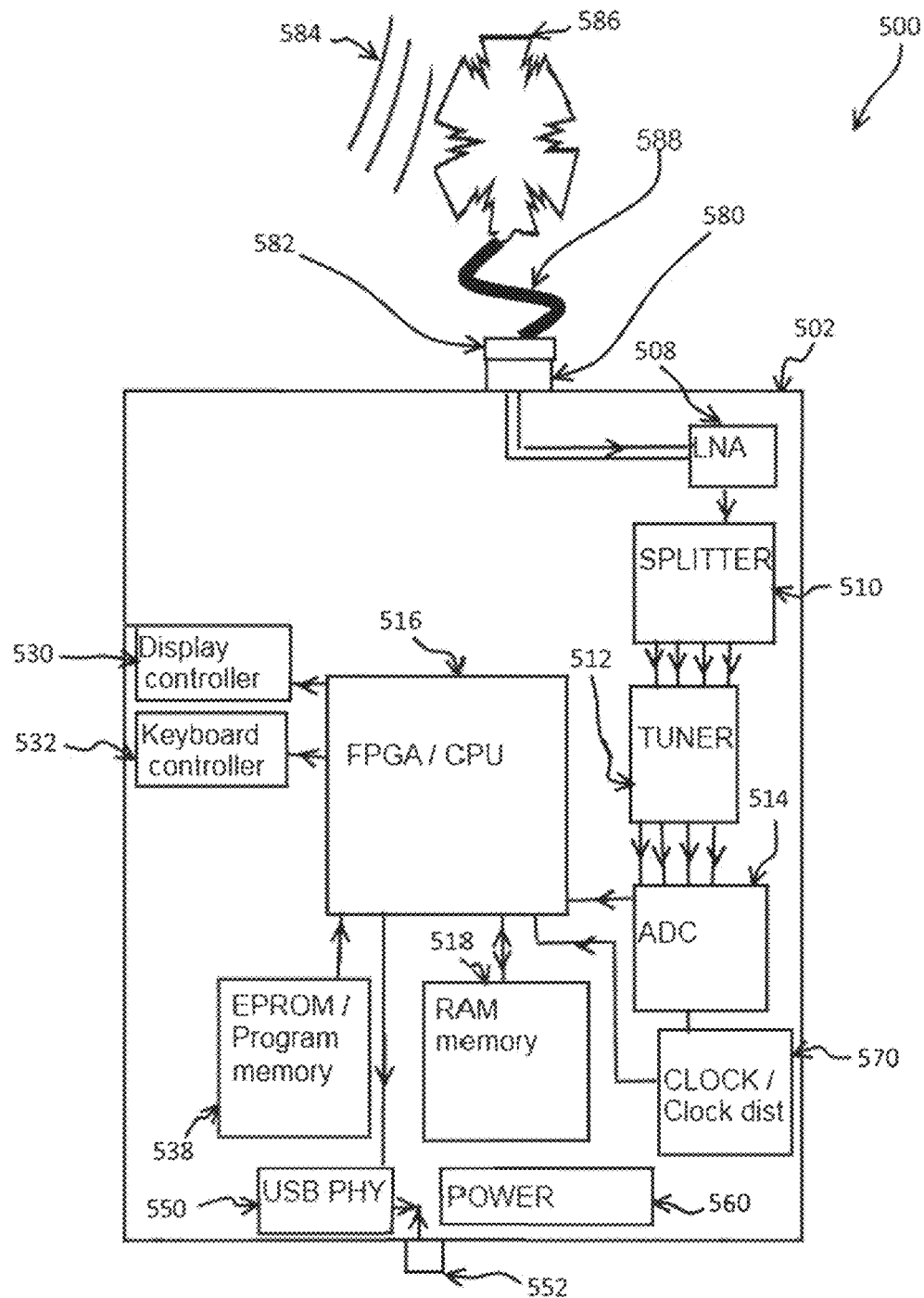
FIG. 5 illustrates an electrical block diagram of an exemplary hardware embodiment of the apparatus in FIGS. 1-3.
Figure 6:
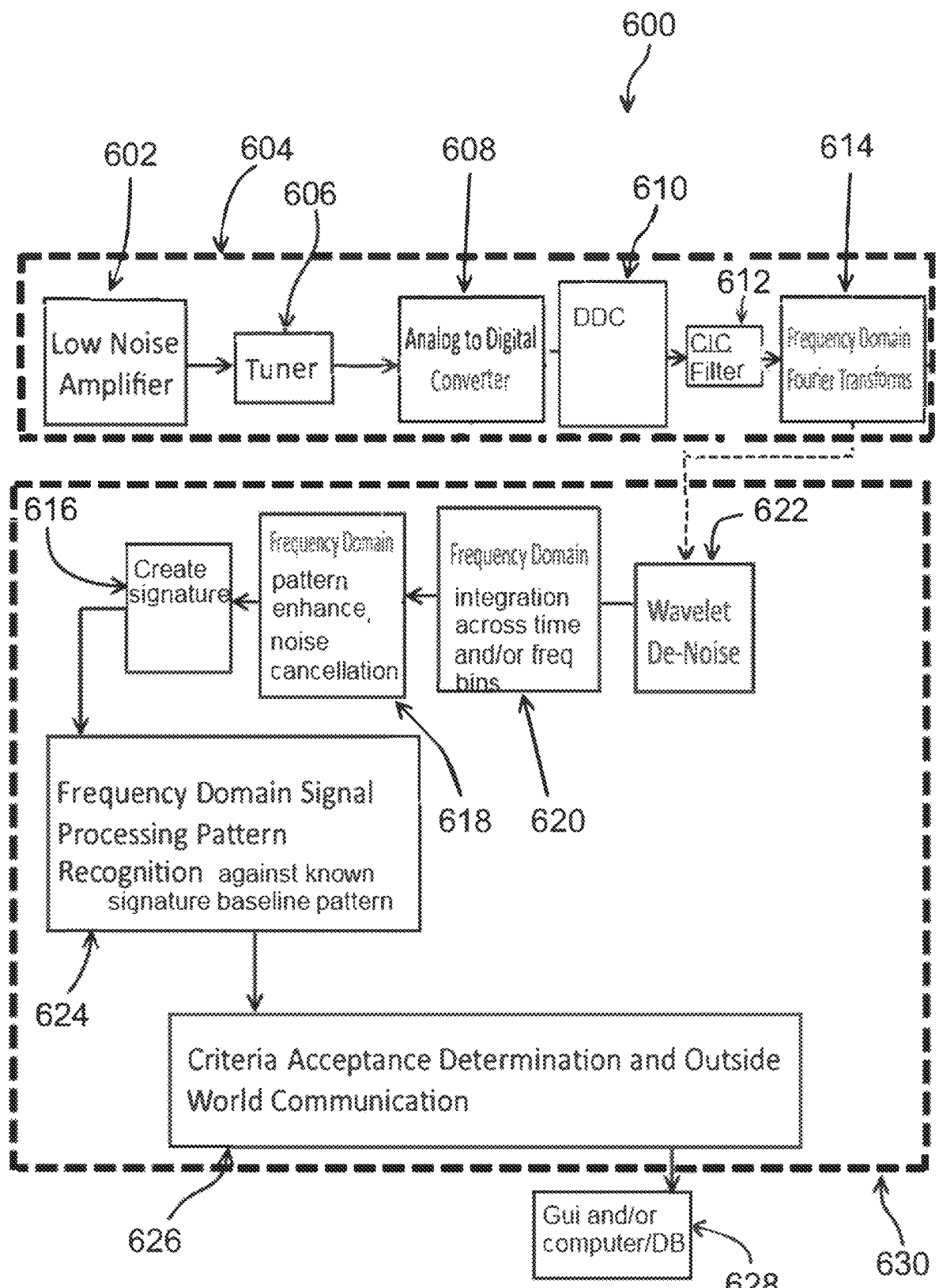
FIG. 6 illustrates a block diagram of an exemplary hardware and software architecture usable in the apparatus in FIGS. 1-3.

All or some modules or controllers of FIGS. 5-6 can be integrated into the housing 305 and operatively coupled to the external antenna 308.

The DUT 320 can be often housed within an instrument panel 324, which may or may not also consist of other electronic devices from which RUL can be measured. This embodiment contemplates the DUT 320 housed within an instrument panel 324, although further embodiments contemplate the DUT 320 can be a stand-alone device, not populated within an instrument panel 324.

In one form, the apparatus 300 can comprise one or more position sensing devices 310 mounted on an exterior surface of the horn-shaped antenna 308. In an example, such position sensing devices 310 can be a laser rangefinder set that is utilized, when provided, for registering the hand-held apparatus 300 relative to the DUT 320. The laser rangefinder set consists of three beams 314 to allow for three-axis, 3-point registration. Three-axis registration refers to the relative positioning of the apparatus 300 in terms of a distance from the DUT 320 and in terms of rotational orientation relative to the DUT 320. For the three-beam registration technique, defined reference points 318 can be provided on a surface of the instrument panel 324. These reference points 318 can be fixed, delineated areas or points on the instrument panel 320 that houses the DUT 320 at which the three beams of the laser rangefinder are pointed. Having fixed points allows for repeating the measurement either successively or at a later time, with the identical orientation of the apparatus 300. The reference points 318 can be defined by the DUT 320. In a non-limiting example, such reference points can be fasteners securing the DUT 320 to the instrument panel 324.

In an example, position sensing devices 310 can be also provided as simple pins with the reference points 318 provided as bores within a thickness of the instrument panel 324.

It is to be understood, that in the embodiment of FIG. 3, the horn-shaped antenna 308 is being sized and shaped to receive the protruding end of the DUT 320 in a direct contact between an interior surface of the horn-shaped antenna and a peripheral edge of the end of the DUT 320, the direct contact forming a shield during capture of the RF emissions 316 and/or 326.

In one form, the LNA 328 can be integrated into the horn-shaped antenna 308. The advantage of integrating LNA 328 is in enhanced sensitivity of the entire system and enhanced level of the signatures given off by the DUT 320 while eliminating unwanted external RF noise which may be introduced by an intervening Coaxial cable between the LNA and antenna. The integrated antenna 308 and the LNA 328 may be mounted within an integrated circuit (IC) to perform electronically steered detection of software or hardware induced characteristics. To further enhance the emission signatures, the LNA 328 with a noise figure of less than one can be employed to better approach the theoretical room temperature sensitivity of the apparatus 300.

A tuner that is housed within the RF detector 330 may be of RF tuner type and can be a general receiver or tuner and the general receiver can be a heterodyne or super-heterodyne receiver or equivalent. The tuner may be completely in firmware or software, with direct digital conversion occurring based on the raw signal captured and converted by A/D converter to instantaneous digital voltages to be digitally down converted in a DDC FPGA instantiation for example. The tuner can be the tuner 512 of FIG. 5 or tuner 606 of FIG. 6.

It is to be noted, that the open end of the horn-shaped antenna 308 can be configured to correspond to the shape of the instrument panel 324, which is shown in FIG. 3, as having an upper portion inclined at an angle relative to the lower portion. Similarly, a curved instrument panel 324 can be also accommodated by changing shape of the open end of the horn-shaped antenna 308.

It is contemplated herein that that horn-shaped antenna 308 can be sized to capture RF emissions 316 from only one specific/unique DUT 320.

It is further contemplated herein that the same horn-shaped antenna 308 can be sized to capture RF emissions 316 from more than one DUT 320 of similar sizes and even of different sizes, by being configured to accommodate DUT 320 of a larger size from a group of DUTs 320 without affecting quality of the measurement and determining RUL of each DUT 320 in the group.

Further embodiments of the apparatus of FIGS. 1-3 are being illustrated in FIGS. 12A-12C, to be explained later in this document, and contemplate housing the antenna in situ, that is within the DUT's enclosure.

Figure 4A:
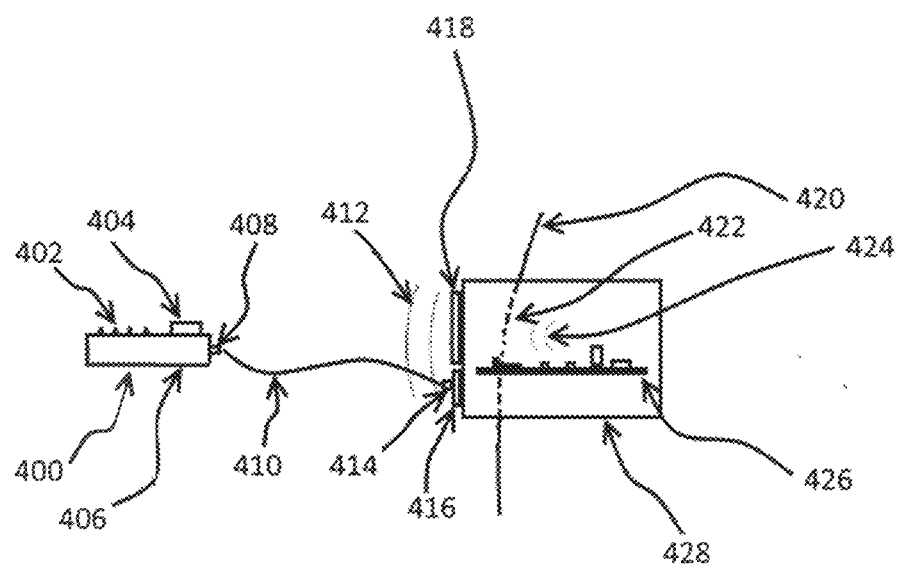
FIGS. 4A-4C illustrates an exemplary embodiment of a hand-held apparatus for testing electrical or electronic device(s)
Figure 4B:
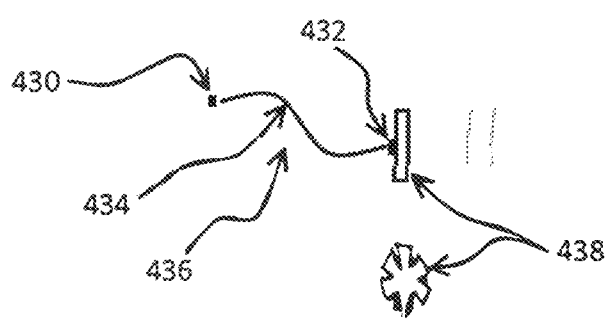
Figure 4C:
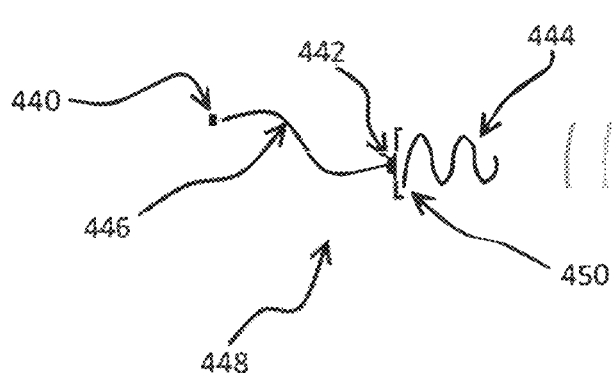

FIGS. 4A-4C further illustrate an interchangeability of antennas to the front connector of the apparatus, as previously discussed and contemplated in FIG. 2. FIG. 4A illustrates the apparatus 400 connected to an antenna that is physically attached to the DUT 428 at attachment point. In this embodiment, the DUT 428 is housed within an instrument panel 420 and contains subcomponents 426 that emanate emissions 424 within the case of the DUT 428. These emissions contribute to the external RF emissions 412 that are captured by the antenna 416. The antenna 416 is in an operative coupling with an RF connector 414. Connector 414 is configured to operatively receive one end of an RF cable 410. The other end of the cable 410 operatively couples to the connector 408, which is the same connector described previously for use with interchangeable antennas. Under this embodiment, registration mechanisms previously contemplated may not be necessary, as under this embodiment the antenna is automatically registered to the DUT by being affixed to the external case of the DUT. The affixed antenna 416 captures the external RF emissions 412 from its registered position on the DUT 428.

Although, the antenna 416 is illustrated as being disposed on an exterior surface of the DUT 428, the antenna 416 can be also disposed within the DUT 428.

FIGS. 4B-4C illustrate specific types of interchangeable antennas that can be connected to the apparatus 400 at the connector 408. In a type 436 of FIG. 4B, a fractal antenna 438 can be affixed to a substrate and connected to the RF cable 434 via the RF connector 432. The RF cable 434 is then connected to the apparatus at connector 430 as previously described. In a type 448 of FIG. 4C, a helical antenna 446, which is composed of metallic antenna elements 444 arranged in a helical pattern is connected via its connector 442 to the RF cable 434, and then connected to the apparatus via the connector 430.

FIG. 5 illustrates a block diagram of an exemplary hardware architecture which may be suitable for assembly on a single board or even a single die within the embodiments of the handheld apparatus, illustrated in FIGS. 1-3. This exemplary hardware architecture can include the LNA 508 as part of the overall RF receiver system 502, although as it has been described above, the LNA 508 can be integrated with the antenna and thus being provided external to the receiver 502. In this embodiment, a fractal antenna 586, is contemplated as one of exemplary antennas coupled to housing of the hand-held apparatus. A cable 588 connects the antenna 586 to the antenna connector 580. Additional embodiments contemplate the antenna 586 being housed within the DUT. As discussed previously, this antenna 586 can be interchanged with another suitable RF antenna, such as shown in FIGS. 1-4C.

The arrows between successive blocks in the block diagram also represent the signal path taken by the captured RF emissions from the antenna 586, through the LNA 508, splitter 510, tuner 512, ADC 514 into the FPGA/CPU 516. Here the splitter 510 is an RF splitter that equally routes the incoming signal into four channels of the device, typically to process different frequency regions by each channel. This is illustrated by the four arrows between the splitter 510 and the tuner 512. Other number of channels can be used. Each channel represents a separate data throughput path. The FPGA/CPU 516 can comprise one or more processors. Such one or more processors can be typically used for down converting and FFT generation and also controls what is displayed on the graphical display 530 and controls the keypad 532, previously described. The FPGA requires a clock signal to maintain normal operation. This clock signal can be provided as an on-board or co-located hardware block 570 or can be coupled from an external source. Output from the FPGA/CPU 516 can be provided through the USB PHY block 550 to a connector 552 and externally connected USB device such as Flash memory, Ethernet hub, computer, database, or internet cloud storage. A non-volatile memory block 538 is also provided within the device as a means to at least store historical records of degradation values and interface with a user. The random access memory block 518 may be an internal part of the computer, a removable external element coupled to the computer, or unit that is remotely accessible via a wired or wireless network. Power for the board can be supplied in this embodiment via a chargeable or non-chargeable battery 560. Further embodiments contemplate power being supplied via a DC power supply.

It is also contemplated that the LNA 508, the splitter 510, the tuner 512 and ADC 514 define a RF receiver, while the FPGA/CPU 516, RAM memory 518 and EPROM/Program memory 538 define a controller.

In any example, memory is not a transitory propagating signal. The memory connected to one or more processors and encoding computer readable instructions, including processor executable program instructions, the computer readable instructions accessible to the one or more processor, wherein the processor executable program instructions, when executed by the one or more processors, cause the one or more processors to perform operations on the RF emissions captured by the antenna and received by the receiver.

FIG. 6 illustrates a block diagram of an exemplary method 600 describing how captured RF (emission) energy is acquired, processed and algorithmically compared to a set of parameters identified for a baseline configuration of an aged or unaged DUT. It is to be understood that such logic architecture is carried out by one or more on-board processors executing non-transitory computer readable medium comprising executable instructions, though it also contemplates other hardware or firmware manifestations to assist or perform the comparison algorithms of verifying a match with the anticipated parameters. The non-transitory computer readable medium has a program recorded thereon for executing the method (performing operations).

FIG. 6 illustrates two functional blocks 604 and 630. The functional block 604 can be also referred to as or defines an RF receiver, while the functional block 630 can be also referred to as or defines a controller. These functional blocks can be provided independently from each other or can be incorporated into a single apparatus.

Functional block 604 can be considered as a front end signal acquisition and raw data processing block, and is illustrated as containing an LNA 602, tuner 606, analog-to-digital converter 608, Digital Down Converter (DDC) 610, Cascade Integrator-Comb (CIC) filter 612 and Fourier Transform (FFT) block 614. As discussed in the embodiments herein, the acquired emissions signal(s) pass through the LNA 602 for low-intensity-signal amplification. In this embodiment, the tuner that is housed within the functional block 604 may be of RF tuner type and can be a general receiver or tuner and the general receiver can be a heterodyne or super-heterodyne receiver or equivalent. The received RF emissions are then digitized in the ADC block 608, converting the raw analog time domain voltages into digital values for processing. One key factor in determining the quality of signal fed into the overall system can be the linearity, number of bits (Effective Number of Bits (ENOB))

and speed of the ADC 608. A higher ENOB for example generates less noisy data resulting in more accurate and/or faster modified/unmodified determination decisions.

The acquired emissions signal(s) is/are passed then through digital down conversion 610, which converts the digitized signal to a lower frequency signal at lower sampling rate (decimation). The DDC 610 may consist of a Direct Digital Synthesizer (DDS), a low-pass filter, and/or a down-sampler for decimation.

Logic step 614 executes a frequency domain Fourier Transform to convert the data in the digital CIC filter 612 into the wavelet de-noising block 622 for further processing in the data processing block 630. In at least one exemplary embodiment, time-domain emission signal data is transformed to the frequency domain by means of a Fast Fourier Transform (FFT) 614. Electromagnetic signature elements and signature region 2-D patterns for comparison purposes can be extracted across a wide frequency band via quantitative analysis. Such signature elements for quantitative analysis may include averaged or statistical quantities representing measurements including the noise floor level, phase noise distribution, absolute and relative peak locations to other peaks, non-linear product peak envelope shape, and the structure of identified peaks.

From there, the now-frequency-domain signature, after undergoing Fourier Transform 614, is now filtered 618 and integrated 620, producing the measured frequency domain signature 616 that is to be quantitatively analyzed, diagrammed by block 624. This block 624 derives the relevant metrics from the measured device and uses the quantified metrics to determine a RUL value. One or more algorithms in step 624 can be executed to match the collected emission signature data to the expected emission signature for the DUT. More than one algorithm may be used to match mutually exclusive parameters of the RF energy emission signature and then combine those using numerically weighted coefficients for each in a linear or nonlinear equation to yield a final Remaining Useful Life value for the DUT. Thus, logic set 624 typically includes at least one of Harmonic Analysis, Matched Filter, non-harmonic correlation, timing correlation, Artificial Neural Networks (ANN), specifically multilayer perception (MLP) feed-forward ANN with back propagation (BP), Wavelet Decomposition, Autocorrelation, Spectral Feature Measurements or Statistics, Clustering or Phase Detrending algorithms. The signature library may be loaded or programmed with datasets for known degradation behavior. The measured dataset can be located within a 2-D or possibly the multi-dimensional signature element space. This location may be transformed to a two or three-dimensional space using Principal Component Analysis (PCA), after which the distance between the device under test and cluster centers for each degradation category may be determined. If the measured dataset falls within threshold of a known degradation cluster, the algorithm declares the device to have a degradation of that category. If the measured dataset falls outside the bounds of known degradation behavior, the device will be declared to be free of imminent failure, significant RUL, etc.

The detection algorithms can also be run offline on raw time domain or frequency domain data acquired elsewhere and/or previously using the system or in a fully automated manner. Automation of the test algorithm and integration within the embedded software architecture is accomplished to fully automate screening of degraded Device components for hardware elements such as parts, boards, or subsystems used and/or in the ADUT. The characteristic signature regions for DUT with hardware degradation is measured. The detection algorithms detect signature elements associated with the degradation. Algorithm results can be used to determine what should be disqualified and/or quarantined.

Detection algorithms or instructions, executed by one or more processors, facilitate detection of degradation and such detection is accomplished in one exemplary embodiment through algorithms that target emission signature elements identified to be of significance. The algorithms or instructions, executed by one or more processors, may encompass multiple stages, starting for example with raw time-domain emission data and ending with an assessment of whether a faulty or degraded device is present in the device under test, inspection and/or examination.

The configuration and/or operation of the apparatus may be also in accordance with disclosures in the U.S. Pat. Nos. 7,515,094 and 8,063,813, both issued to Keller, III; in the U.S. Pat. No. 8,643,539 issued to Pauly on Feb. 4, 2014; and in the U.S. Pat. No. 8,825,823 issued to Keller on Sep. 2, 2014, all owned by the assignee of the instant subject matter and whose teachings are being incorporated herein in their entirety by reference thereto.

Now in reference to exemplary signature metrics created by the apparatus of FIGS. 1-6, example spectral signatures are described in detail. Note, that these signatures described herein are representative signatures that are collected and analyzed by the apparatus. Other signatures and metrics not explicitly described herein can be considered to be obvious logical extensions of these signatures by someone of ordinary skill and expertise in the field.

Figure 7:
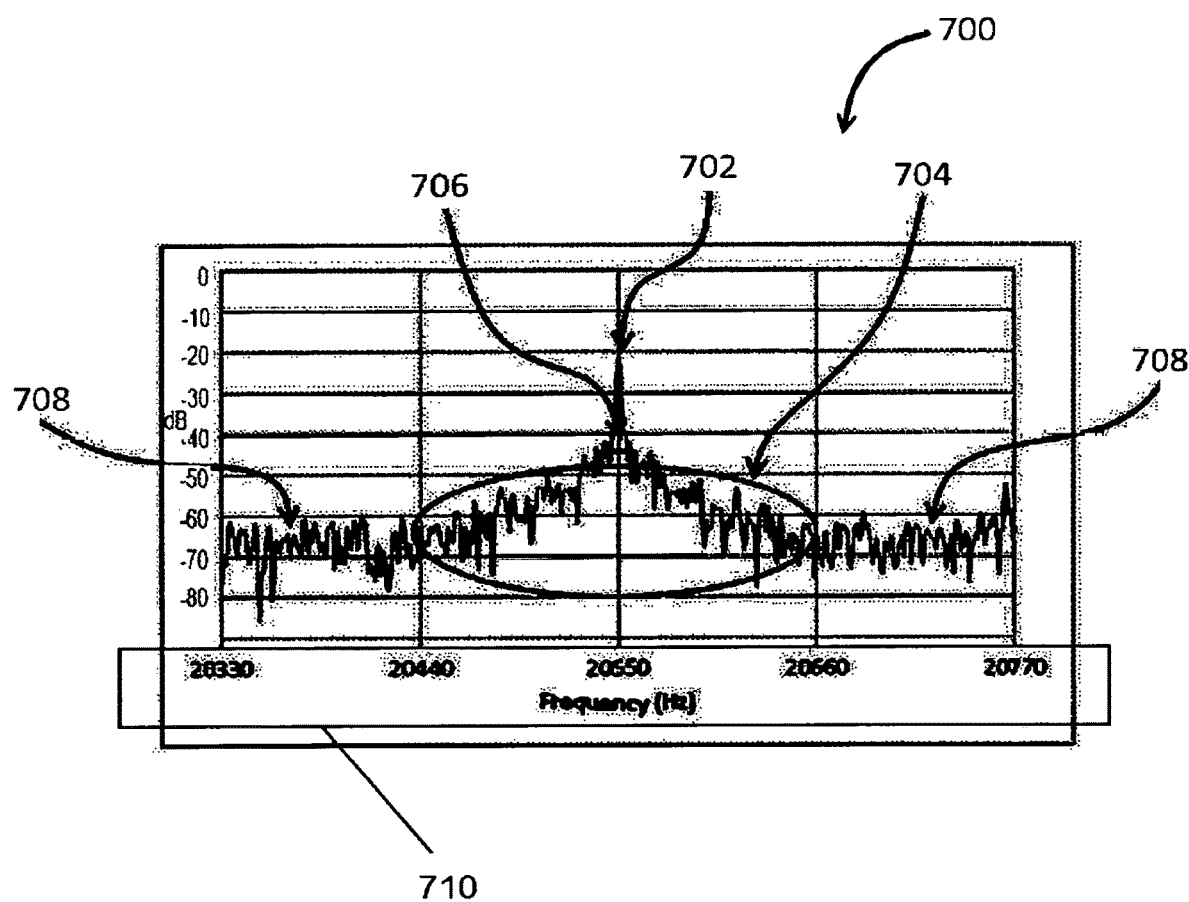
FIG. 7 illustrates an example of an electromagnetic spectrum that can be capture and analyzed by a hand-held apparatus.

FIG. 7 illustrates an exemplary electromagnetic signature profile 700 that displays quantifiable metrics that can be used for determining RUL. In the profile (spectrum) 700, a single peak 702 is shown in the frequency range 710 of 20330-20770 Hz. The spectrum consists of a primary peak 702 with significant SNR, with the noise floor of the spectrum indicated by 708. The central peak 702 is also featured in this contemplation as a significant phase noise attachment, indicated by significant broadening of the curve between −60 dB and −40 dB on the vertical axis, shown by the circled area 704. The broadness and general shape of this region, as well as the Full-Width-Half-Maximum 706 are metrics that can be used to determine RUL. In some embodiments of 700, the curve shape 704 and FWHM 706 show a semi-monotonic trend as the device from which such a spectrum is acquired progress along its aging curve. This trend of change can be used as a prognostic formula or function to predictively determine the RUL of the DUT.

The position and characteristics of the noise floor 708 is also a signature metric that can serve as an indicator for RUL prognostication. In FIG. 7, the noise floor 708 is approximately constant across the spectral region 710, approximately 440 kHz. Other embodiments contemplate a noise floor that, as the DUT ages, deviates from being constant across the frequency region of interest 710. This deviation from being constant is contemplated as additional spectral feature(s) that gradually appear and increase in amplitude as the device ages, or broadband features whose FWHM is comparable to a significant fraction of the frequency region of interest 710.

Figure 8:
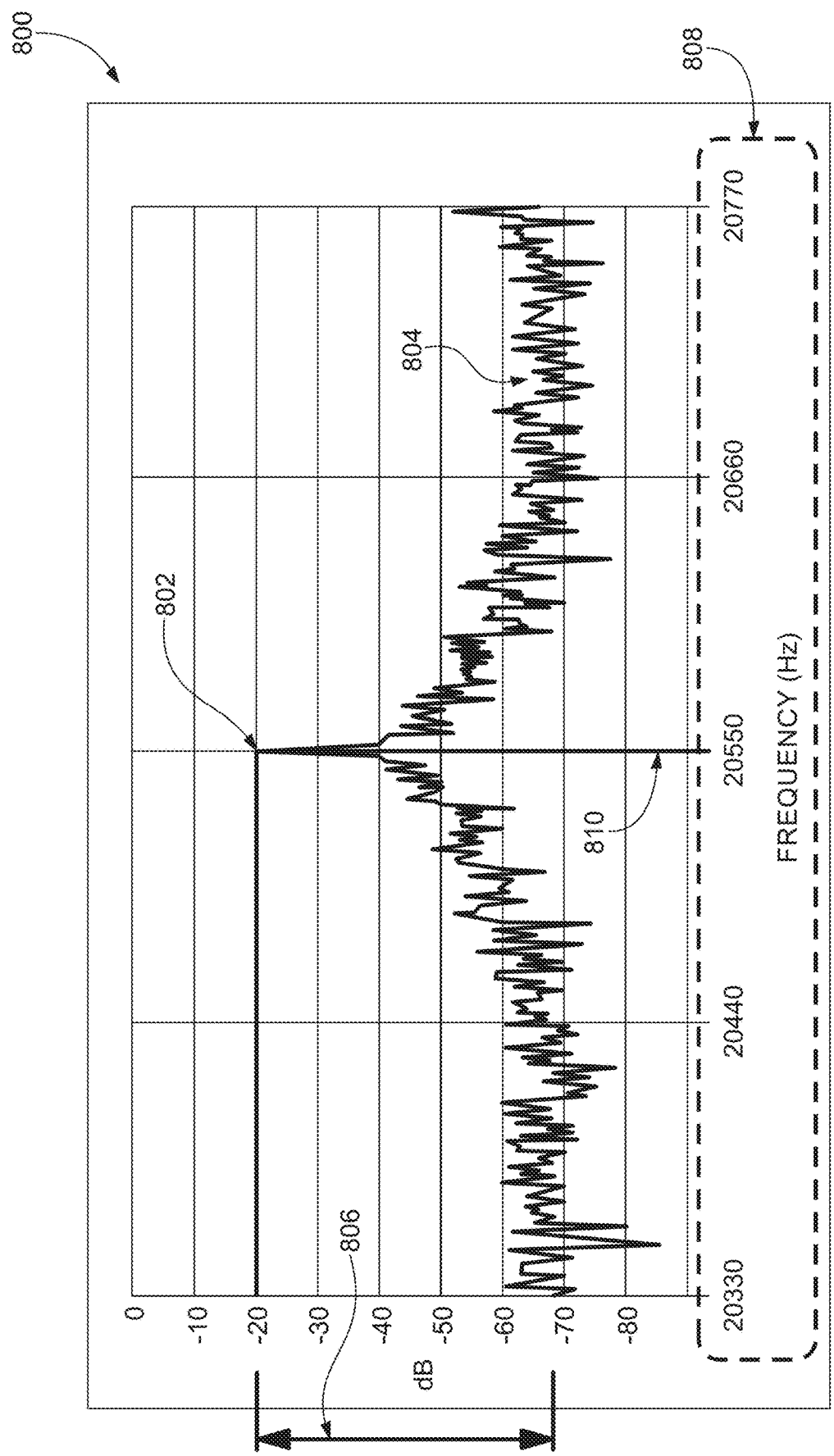
FIG. 8 illustrates an example of an electromagnetic spectrum that can be capture and analyzed by a hand-held apparatus.

FIG. 8 illustrates an exemplary electromagnetic signature profile 800 acquired from an DUT with different metrics (as compared to the profile 700 in FIG. 7 used for determining RUL detailed. In FIG. 8, the spectral feature is a central peak 802 with characteristic amplitude 806, a characteristic peak position 810, and characteristic noise floor 804. This feature also appears in the region of interest 808 20330-20770 Hz. In this contemplation, a positon of the peak 804 is a quantifiable indicator of RUL of the DUT. Specifically, a baseline DUT will produce a characteristic peak position, such as 810. As the DUT ages progressively, the peak position 810 will move along the horizontal axis, in a trend-like fashion that is correlative to the device's aging curve. Contemplations of this shift in peak frequency can include either positive or negative shifts in peak frequency. The exemplary apparatus of FIG. 1, 2 or 3 can detect these shifts and use their quantification to determine the DUT's RUL.

In an embodiment, the peak amplitude 806 is a quantifiable indicator of RUL of the DUT. Specifically, a baseline DUT will produce a characteristic peak amplitude 806. As the DUT ages progressively, the peak amplitude 806 will either increase or decrease, in a trend-like fashion that is correlative to the device's aging curve. Contemplations of this change in peak amplitude can include either positive or negative change. The apparatus of FIG. 1, 2 or 3 can detect these changes in amplitude and use their quantification to determine the DUT's RUL.

In reference to FIGS. 7 and 8, these signature features are not limited to the frequency region indicated. This frequency region can be in any sub-region within the RF range, 3 kHz to 300 GHz.

Figure 9B:
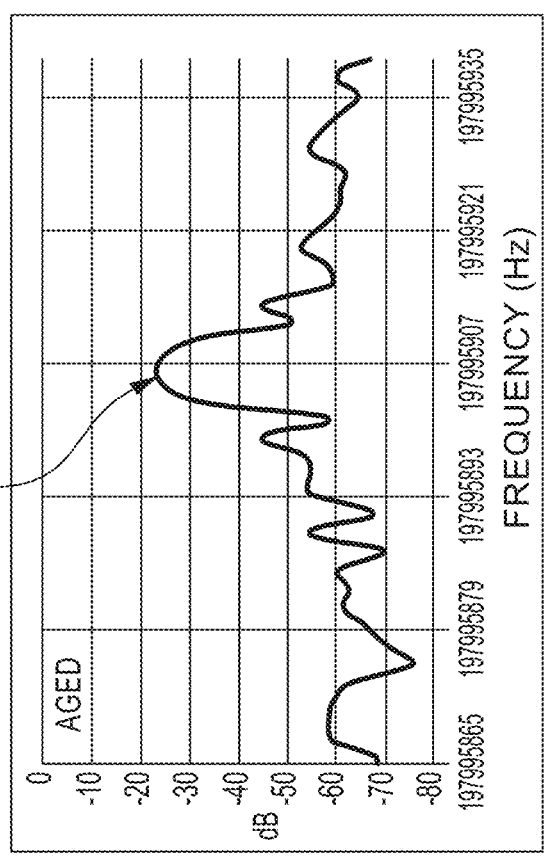
FIGS. 9A-9B illustrate an example of an electromagnetic spectrum that can be capture and analyzed by a hand-held apparatus.
Figure 9A:
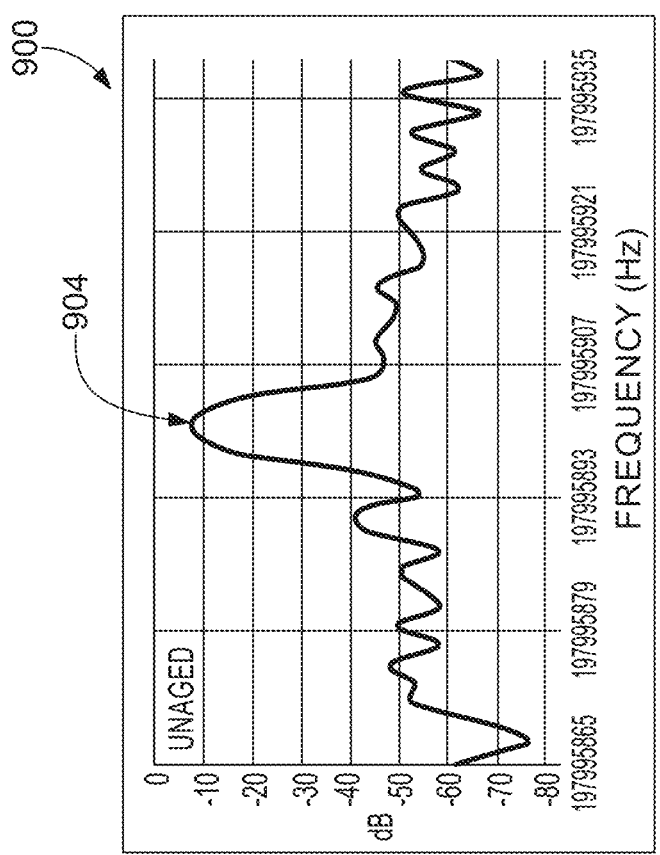
Figure 10:
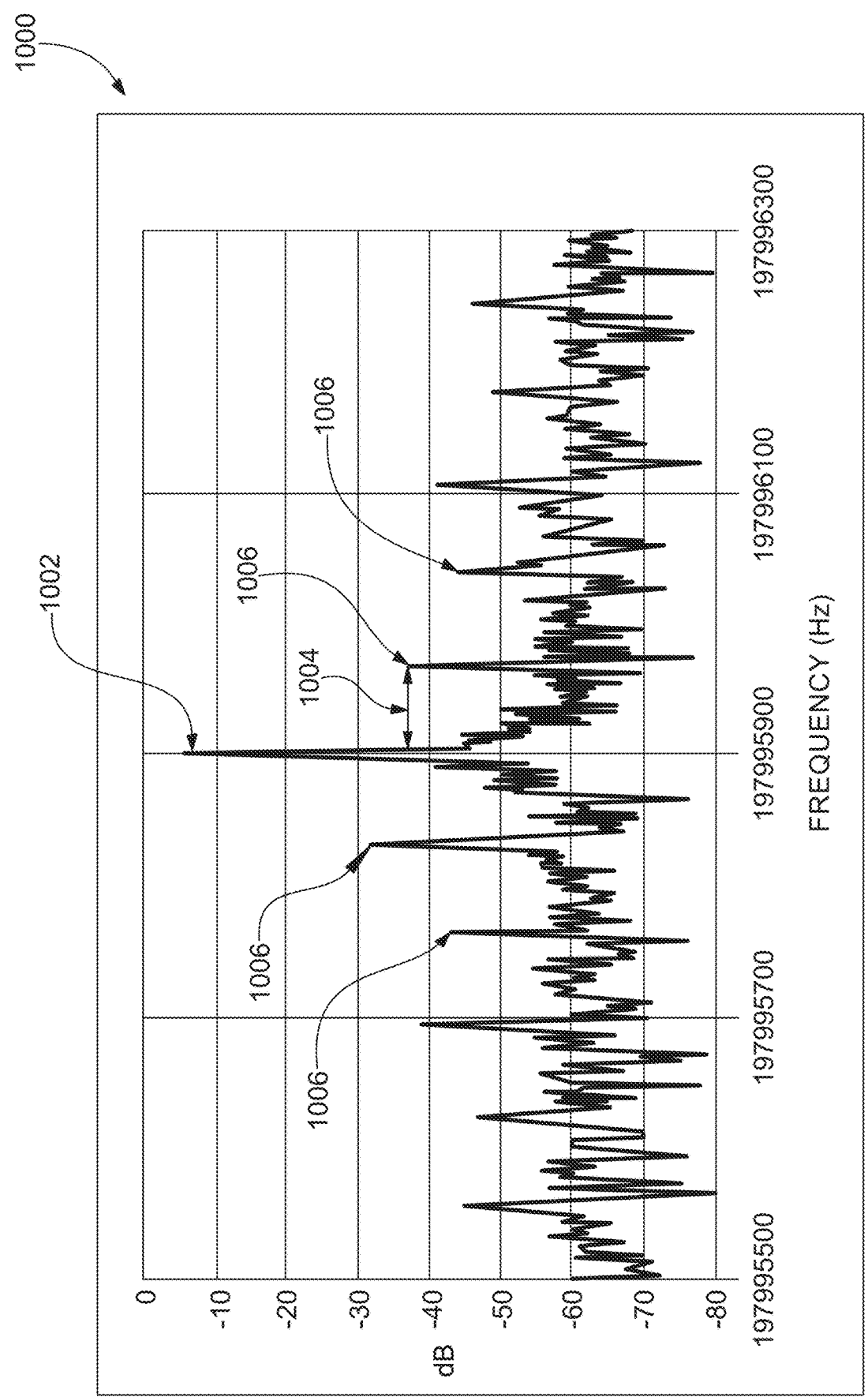
FIG. 10 illustrates an electromagnetic spectrum that exhibits cross modulation content with the characteristic mixing frequency spacing.

The apparatus in any of the described exemplary embodiments may consistently acquire the spectrum region shown as spectrum 900 in FIG. 9A from a known good device, whereas the same spectrum region frequency, frequency span and resolution bandwidth shown in spectrum 902 of FIG. 9B consistently acquired from an unknown device would be an indication it contained a degraded oscillator chip. As an example of spectral indicators of device aging, in comparison with non-degraded devices as seen in spectrum 902 of FIG. 9B, degraded devices show a slightly wider FWHM value, additional phase noise attachment, and reduced SNR. A key consideration by the software algorithm can comprise a presence of such differences in features between the aged and unaged devices. These feature changes may manifest as a consistent evolution as the devices proceeds along its aging curve. These feature changes may manifest in the same frequency region for each device. Therefore, the logic may be programmed or configured to examine the acquired frequency spectrum either for presence of new peaks or an absence of previously detected peaks.

Coupling of weaker internally emitted signals within the DUT results in characteristic signature elements readily describable by established mathematical relationships. These characteristic signature elements are shown as 1006 in FIG. 10, and manifest as a series of sharp Delta-like peaks that are symmetrically spaced around a center peak. The center peak is shown as 1002 in FIG. 10. The characteristic frequency spacing between the center peak and each subsequent cross modulation product is called out as 1004, and provides a characteristic metric for determining Remaining Useful Life. The general expression for a modulated signal can be written as shown in Equation 2.

$$v_M(t) = A_c \cos(2\pi[f_c + g_{mod}(t)\Delta f]t) \qquad \text{Equation 2}$$

For a modulating signal gmod(t)=cos(2πfmt), Equation 2 can be expanded using Bessel trigonometric identities, shown in Equation 3. The nth order Bessel Function of the first kind governs mixing characteristics such as frequency separation 1004, amplitude envelope of peaks 1006 comprising the emitted signature of cross modulation products.

$$S(t) = A \sum_{-\infty}^{\infty} J_n(\beta)\cos[(\omega + n\omega_{mod})t] \qquad \text{Equation 3}$$

$$\beta = \frac{\Delta f}{f_b} = \frac{|f_0 - f_1|}{f_b}$$

For illustrative purposes, Equation 4 shows a Bessel function of the first kind; wherein n is the cross modulation peak index, and β is the modulation index.

$$J_{(n)(\beta)} = \sum_{k=0}^{\infty} \frac{-1^k \left(\frac{\beta}{2}\right)^{(n+2k)}}{k!(n+k)!} \qquad \text{Equation 4}$$

The mixing characteristics of the cross modulation signature discussed above are governed by the value of the modulation index β. The value of beta, and hence the character of the spectrum 1000 are indicators of device age, meaning that the characteristic value of β is dependent on the age of the DUT in a characteristic way. This embodiment contemplates the calculating the value of β as part of the embedded software processing of the hand-held apparatus and using its functional relationship to device age to perform Remaining Useful Life prognostics of the DUT.

FIGS. 11A-11B illustrate an exemplary embodiment utilizing characteristics of harmonically related peaks to perform RUL prognostics. An exemplary DUT signature consisting of two peaks 1108 and 1104 that are part of a harmonic spectrum. These signals are the 15$^{th}$ and 18$^{th}$ harmonics of a 5 MHz fundamental frequency, as these peaks are centered at the 15$^{th}$ and 18$^{th}$ multiples of 5 MHz, the fundamental frequency. The frequency positions of these peaks are illustrated by 1106 and 1110. Aging of the DUT can result in the oscillator responsible for producing the 5 MHz fundamental frequency to experience jitter, which is a deviation from true periodicity in a periodic signal. Typically, electronic oscillators will be specified to a certain fundamental frequency, with a tolerance that is a small percentage of the fundamental oscillator. Aging of the DUT can result in the fundamental frequency shifting outside of the specified tolerance bounds. For example, the shift of the fundamental frequency due to aging can be measured as Δf. This results in the frequency positon of the higher order harmonics, 1110 and 1106 in FIGS. 11A-11B to deviate from its expected value by 15×Δf and 16×Δf, respectively. The measure of deviation from the expected peak value of these peaks is therefore an indicator of Remaining Useful Life of the DUT, and can be used to predict RUL via the software processes within the hand-held apparatus.

Figures 12A, 12B, 12C:
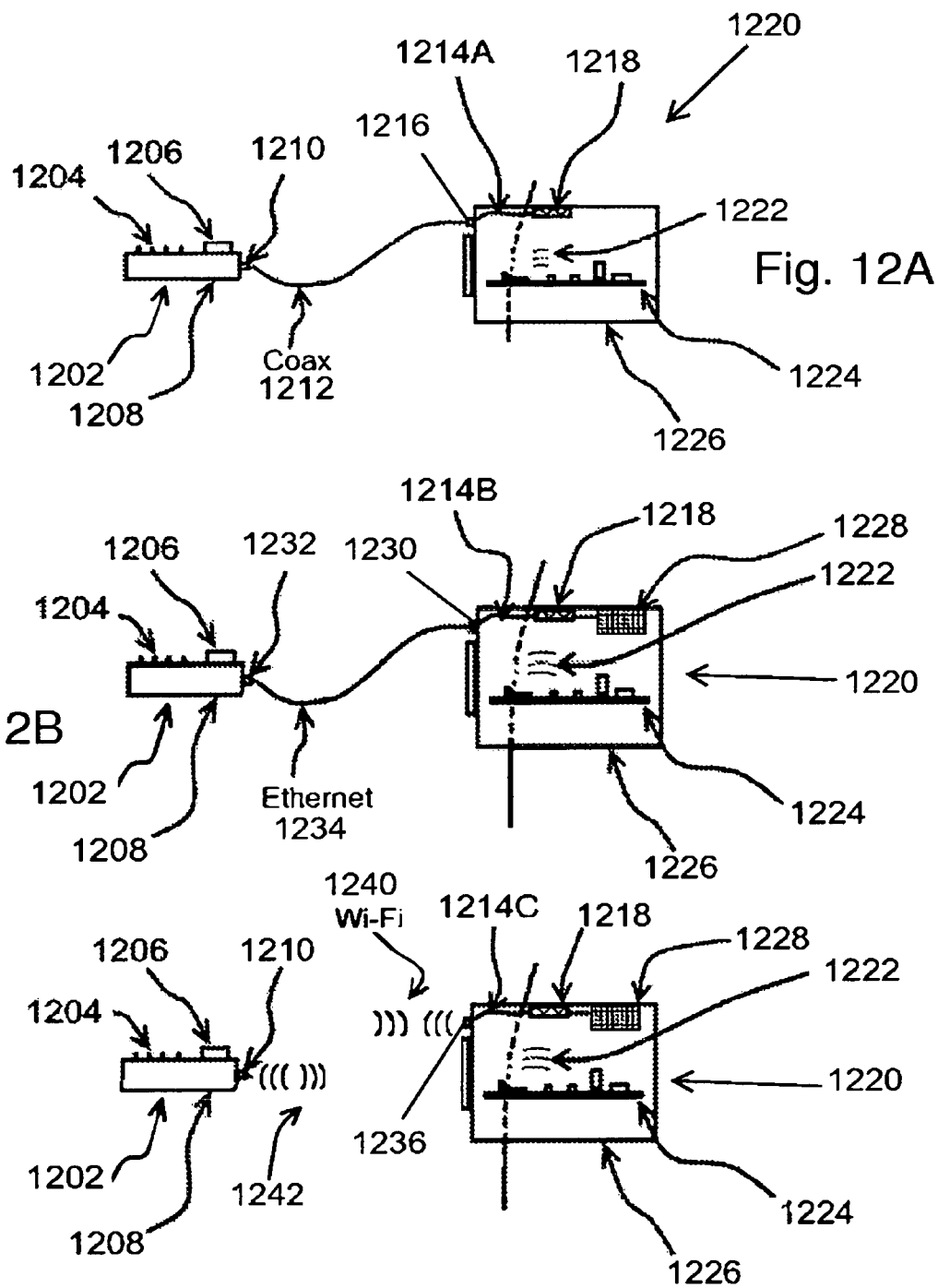
FIG. 12A illustrates one example of connecting a hand-held apparatus to antennas that are placed in situ within the DUT.
FIG. 12B illustrates one example of connecting a hand-held apparatus to processors and antennas that are both in situ with the DUT.
FIG. 12C illustrates one example of connecting a hand-held apparatus connected to processors and antennas that are both in situ with the DUT.

In an embodiment, the antenna is integrated in situ within the housing of the DUT, for example as is illustrated in FIG. 12A. In this embodiment, the antenna 1216 is housed within the DUT 1226 and electrically accessible by the apparatus 1202, which includes a keypad 1204, graphical display 1206, and case 1208, via an RF cable 1212. The RF cable 1212 connects to the apparatus 1202 via an RF connector 1210 attached to the front of the case 1208. The signal is routed through the hardware and software architectures described by FIGS. 5 and 6 within the apparatus 1202. The antenna placed in situ with the DUT 1226 has an RF cable 1214A inside the housing of the DUT 1226 connected from the in situ antenna 1216 to the front of the DUT 1226 and connected to the RF cable 1212 via an RF connector 1216.

In this embodiment, the antenna 1218 can collect emissions 1222 from the DUT subcomponents 1224 directly, without having them be potentially shielded by the metallic case of the DUT 1226. In this embodiment, the hand-held apparatus operates to perform analysis and processing of the acquired data from the antenna 1218 and report RUL of the user through the graphical interface 1206, navigable using the keypad 1204.

FIG. 12B illustrates an embodiment where the data processing module is being housed within the DUT in a similar fashion as an in situ antenna as previously discussed and illustrated in FIG. 12A. In FIG. 12B, the in situ antenna 1218 is also accompanied by an RF processing module 1228. In this embodiment, the DUT 1226 is housed during its normal operation within an exemplary instrument panel 1220. The instrument panel 1220 may house additional devices that can also be tested by the apparatus. In this embodiment, the RF processing module 1228 and antenna 1218 capture, analyze, and process the RF data within a hardware module that is located within the device and performs constant monitoring of the internal components 1224, through analysis of the unintended emissions 1222 within the DUT 1226. In this embodiment, the hand-held apparatus is utilized as a receiver, whereby the processing and analysis results from the in situ processing module are read-out by the apparatus 1202 via its graphical interface 1206, which again in this embodiment includes an exterior case 1208 and a keypad 1204 for navigation within the graphical interface. In this embodiment, the results are sent from the processing module 1228 to the hand-held apparatus 1202 via an Ethernet link 1234. In this embodiment, the DUT 1226 houses an Ethernet connector 1230 that allows physical access to the in situ antenna 1218 and processing module 1228. Processing occurs within the processing module 1228 and is being outputted through the Ethernet link 1234.

FIG. 12C illustrates an embodiment where the results, for example such as RUL, from the in situ processing module 1228 being sent to the hand-held apparatus 1202 via a Wi-Fi Wi-Fi Transceiver and Antenna 1236. The Wi-Fi signal 1240 is sent to the hand-held apparatus 1202 and is received as a signal 1242 by a Wi-FI antenna 1210, and RUL prognostics results are displayed to the user on to the hand-held apparatus 1202 via its graphical interface 1206.

Figure 13:
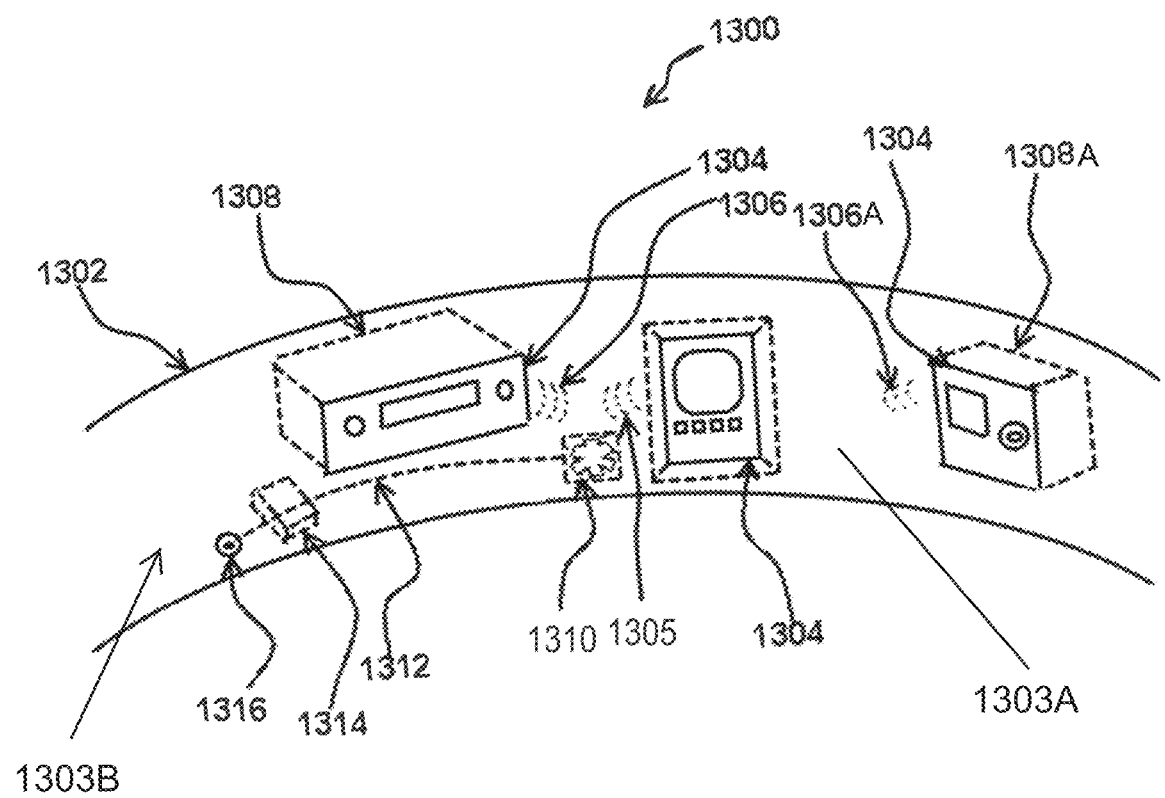
FIG. 13 illustrates an exemplary instrument panel or a dashboard with emissions receiving antenna mounted behind it.

FIG. 13 illustrates an exemplary embodiment of an instrument panel assembly 1300 that comprises an instrument panel 1302. The instrument panel 1302 has an exterior surface 1303A and interior surface 1303B. The instrument panel 1302 can be also referred to as a dashboard. The instrument panel assembly 1300 also comprises instruments 1304, 1308, and 1308A, although more or less instruments is also contemplated herewithin. The instrument 1304 emits a near field RF emissions 1305. The instrument 1308 emits a near field RF emissions 1306. The instrument 1308A emits a near field RF emissions 1306A. Antenna 1310 is mounted on or next to the interior surface 1303B, the antenna 1310 configured to capture one or more emissions of an electromagnetic energy in a radio-frequency (RF) range, the one or more emissions of the electromagnetic energy being emitted from one or more electrical instruments mounted within the instrument panel. In an example, the antenna 1310 can be positioned and configured to capture RF emissions only from one instrument, for example such as RF emissions 1305 from the instrument 1304. In this example, the antenna 1310 is positioned within or next to the near field of RF emissions 1305. In an example, the antenna 1310 can be positioned and configured (selected) to capture RF emissions from a pair of instruments, for example such as the emissions 1305 from the instrument 1304 and emissions 1306 from the instrument 1308. In this example, the antenna 1310 is positioned between the near field of the RF emissions 1305 and the emissions 1306. In an example, the antenna 1310 can be positioned and configured to capture the RF emissions 1305 from the instrument 1304, the RF emissions 1306 from the instrument 1308, and RF emissions 1306A from the instrument 1308A. In other words, the antenna 1310 configured to capture one or more emissions of an electromagnetic energy in a radio-frequency (RF) range, the one or more emissions of the electromagnetic energy being emitted from one or more electrical instruments 1304, 1308, 1308A mounted within the instrument panel 1302. The antenna 1301 can comprise any one of a loop antenna, a fractal antenna, a horn antenna, a dipole antenna, and an inverted-F antenna (PIFA). The instrument panel assembly 1300 also comprises a user interface connection 1316 mounted within the instrument panel 1302 and being accessible from the exterior surface 1303A. Such user interface connection 1316 can be a connector, for example such as an RF coaxial cable connector.

In an example, the instrument panel assembly 1300 only comprises a connection between the antenna 1310 and the user interface connection 1316. Such connection can comprise a Coaxial cable 1312.

In an example, the instrument panel assembly 1300 can comprise a connection between the antenna 1310 and the user interface connection 1316 and an apparatus 1314 mounted in a path of such connection 1312. The apparatus 1314 in this example can be a receiver or a sensor configured to receive the electromagnetic energy captured by the antenna and at least convert the one or more emissions captured by the antenna 1310 from an analog form signal to a digital form signal. The user interface connection 1316 can then be use to communicate the digital form signal to the controller or processing device. The controller or processing device can be also a computer configured with hardware and/or software to process the digital form signal in accordance with this disclosure. The receiver or sensor 1310 can be of the type as shown in FIGS. 5-6. The apparatus 1314 in this example can be also configured to comprise both a receiver and a controller. The controller can at least comprise one or more processors, and a memory that is not a transitory propagating signal, the memory connected to the one or more processors and encoding computer readable instructions, including processor executable program instructions, the computer readable instructions accessible to the one or more processor, wherein the processor executable program instructions, when executed by the one or more processors, cause the one or more processors to perform operations at least comprising generate a digital signal in a time domain, the digital signal representing the one or more emissions, convert the digital signal from the time domain to a frequency domain, the digital signal containing a signature of the one or more emissions, process the signature of the one or more emissions, and determine a condition of the one or more electrical instruments.

FIG. 14A illustrates an embodiment of a LRU 1410 comprising a chassis 1412 shown in an open state and containing computer/logic cards 1414. Arrows 1416 illustrates an exemplary direction of placement or removal of the card 1414. The removed card 1419 shows an antenna 1418 that can be configured to capture emissions 1433 from one or more cards 1414. In other words, the card 1419 can define an apparatus that can be configured to only capture RF energy, capture and receive RF energy or capture, receive and process RF energy. In either example, the output, for example RUL value, can be communicated by a member 1422, which can be a cable or a wireless connection. Also shown is RF emission 1420 propagating external to the chassis 1412.

FIG. 14B illustrates an embodiment, wherein emissions monitoring apparatus 1436 is positioned outside of a chassis 1430 with the chassis 1430 or a chassis lid 1432 adapted to contain a RF transparent window 1434 to enable RF emissions from inside the chassis 1430 to be received by the apparatus 1436. Emission evaluation results, for example such as RUL value, and/or RF emissions signal may be sent over communication cable 1422.

In the embodiments of FIGS. 14A-14B, the apparatus 1436 can comprise only an antenna, both antenna and receiver, or a combination of antenna, receiver and controller. The communication member 1422 will be coupled accordingly, depending on the compassion of the apparatus 1436.

FIG. 14C illustrates an embodiment of the chassis 1440 in a closed state with the antenna 1442 being positioned external to the chassis 1440 and configured to capture RF emissions 1420 emitted by the logic cards within the chassis 1440. Captured emissions are communicated by a cable 1444.

An embodiment associates the emission signature change with the amount of circuitry that is functionalized by a software program. This can be measured as the aggregate energy or as frequency relationships such as harmonics or intermodulation products and can be applied over narrow bandwidths or wide bandwidths as the circuitry and software characteristics combine to offer useful features within those regions. Dimensional transformations such as Principal Component Analysis (PCA) can be used to more clearly denote differences in observed phenomenology for each category. Results of PCA can further discern clusters of malware taxonomy including a cluster region associated with a specific range of values of a $1^{st}$ and $2^{nd}$ principal component axes such as dB change in noise floor versus phase noise distribution in dB/(Hz*degrees). The cluster regions can include a malware region, an exemplary emission cluster, a performance degradation cluster, and a change in functionality cluster.

Unintended radiated emissions from complex ICs, systems, subsystems, boards, peripherals, FPGAs or other electronic devices in Devices utilizing a clock source provides a means for detecting hardware aged through routine use or deliberately in an extreme temperature, humidity, or electronic supply voltage, input signal voltage or current, or supply current environment as any minute change to IC circuitry or program execution within IC circuitry necessarily and predictably affects their emission signature. Routine screening can be easily and fully automated, from start to finish or through any part of the screening process, to enable 100% screening for critical applications. The developed subject matter provides the ability to scan devices for degree of aging or as an initial test standard of comparison on a separate test platform prior to integration with a system under development, removing any possibility of mistaking aged for unaged systems. Full automation is accomplished via Data Acquisition, Signature Analysis, and Part Handling performed without operator intervention:

In one exemplary method, in the data acquisition phase the signal processing of raw waveforms emitted from the known good or known unaged operating device, system, subsystem or component under test is used to acquire frequency-domain data on which detection and assessment algorithms operate. The acquired frequency-domain data can then be searched for characteristic patterns indicative of possible unique signatures associated with the aging influenced hardware under test. The detection system may be performed in an automated mode.

In the signature analysis phase the emission signature analysis is accomplished through algorithms that extract characteristic signature elements and examine them for indicators of aged circuitry characteristics. Established algorithms for signature element extraction can be active within the system.

In an embodiment, the unintended emission analysis hardware and software system may be configured in a handheld embodiment operable by a user manually. Other forms of the above or below embodiments use time domain analysis of emitted signals and/or frequency domain analysis of emitted signals. One exemplary embodiment may use harmonic phase analysis to assist in further determining if emission signatures can be the ones being compared with a higher degree of accuracy, some embodiments may use non-coherent signal integration techniques to further reduce the noise of received emissions. One exemplary embodiment may be directed towards estimating the loss of useful lifetime and total Remaining Useful Life as a result of activity due to exposure to excessive temperatures outside the stated limits of operation by the manufacturer. Another exemplary embodiment may be adapted to locate counterfeited electronic Device devices. Some embodiments may first locate counterfeit Device devices, then examine them to determine if they can be properly used, even though they are counterfeit.

It must be noted that a Trojan, malware, modified or unmodified software, hardware or firmware can directly accelerate aging of a device, component, board, subsystem or system. A key example of this would also be a Rowhammer attack. This can cause the Remaining Useful Lifetime to decline through the increased usage of system hardware resources such as CPU time, I/O use, additional active circuitry drawing current or additional gate usage, more frequent occurrences of usage or more power or less time efficient operations. Disclosed in patents incorporated by reference herein can be apparatus, systems and means to measure overall degradation by comparison of baseline signatures of substantially new operational devices, components, boards, subsystems or systems with baseline signatures of aged, degraded devices, devices which have exceeded their recommended operational parameters, or devices which have been aged more due to additional use of their capabilities such as overclocked or overvoltage devices or devices which have not been properly or more optimally configured to run in a lower speed or energy usage state. Emission signature of devices can be matched with a known RUL to interpolate a calculated RUL. Thus, not only components, subsystems or systems which contain malware or modified software can be identified, but calculation of the shortened and final RUL of a device as a result of the malware presence can be carried out. The degradation of the device due to the potential added load of malware, Trojan, or additional software being executed can be quantified or expressed in terms of % RUL lost based on the instant subject matter in combination with previous subject matters incorporated by reference such as U.S. Pat. No. 8,643,539 issued to Pauly et al. and entitled "Advanced manufacturing monitoring and diagnostic tool". Thus, the capability is taught herein to detect aging and decrease of RUL caused by such Trojans, malware, software modifications, software version back-outs, or lack of software modifications.

Subject matter may employ a linear extrapolation or non-linear extrapolation, with said extrapolation based on linear or non-linear regression of spectrum characteristic(s) vs. RUL and/or vs. previously measured Time To Failure (TTF) minus (−) current cumulative running time and/or vs. current percent of MTTF to predict actual real-time RUL.

Subject matter may employ electromagnetic emissions analysis of device electronics including spectrographic analysis, time-frequency analysis, and electromagnetic emission radiation response to input signal variations.

Prior to analysis, an exemplary system calibration Device specimen (SCAS) may be used to ensure that the apparatus is operating properly for the assembly being analyzed. An SCAS may be analyzed at the beginning of the examination of a lot of devices, and then a reanalysis of the same SCAS may be performed at the end of the examination. SCASs may be typically analyzed and verified with the full range of acquisition settings (for example, when spectral resolution band width (RBW) is changed during an examination to view multiple spectral features, SCASs may be subject to those same settings).

To prepare the system for electromagnetic emission acquisition the following steps may be performed. Acquisition of electromagnetic emissions can proceed using automated measurement and logging equipment, such as for example with any above described apparatus, in a response to the appropriate driving stimuli. Appropriate sensitivity (less than that which saturates the LNA, A/D or other analog components) may be used for each individual frequency span. Appropriate frequency resolution may be used. High resolution bandwidth inspection and minimum number of frequency spans may be determined by the function and complexity of the DUTs. As an example, 1 Hz RBW and frequency spans can be typically used for high confidence in low complexity parts. Digital representations of electromagnetic emissions may be compared and contrasted with specific focus on emission homogeneity, consistency, and uniformity. This process may be automated. It is normal to have some variation across different date and lot codes but not normally in parts with the same date and lot code. Additional analyses may be performed on parts that exhibit anomalies in their radiated electromagnetic emissions. The acquisition of the DUT's electromagnetic emissions may be repeated multiple times and combined to decrease the amount of uncertainty.

The step of measuring the feature value may be performed serially or concurrently with a step of measuring the baseline device feature value.

The executable instructions, when executed by the one or more processors or logic devices, may also cause the one or more processors or logic devices to perform an additional step of electromagnetic emissions analysis including at least one of a spectrographic analysis, a time-frequency analysis, an electromagnetic emission radiation response analysis related to input signal variations, a phase analysis, an informatics analysis, and a statistical analysis.

The at least two different physical electrical devices may include at least one of a baseline device electrical device and an unexamined device, at least two different baseline electrical devices of a different type, at least two unexamined devices of the same type, at least two different baseline electrical devices of the same type, and at least two unexamined devices of a different type. In an avionics application, the baseline electrical device and one or more electrical devices may be located, during operation of the apparatus, within an aircraft or aircraft cockpit.

In another exemplary embodiment, an apparatus comprises an attached or attachable antenna; an emissions acquisition assembly, configured, to receive, in an analog form, unintended emissions of electromagnetic energy being given off by an electrical device and to covert the received unintended emissions into a digitized data; one or more processors; and a non-transitory computer readable medium comprising executable instructions that, when executed by the one or more processors, cause the one or more processors to perform the steps of: identifying a spectral frequency region within a sample unintended emission, measuring a value of a parameter of the spectral frequency region in the sample unintended emission, measuring value(s) of the parameter in one or more of subsequent unintended emissions, and determining, based on distinct changes in the values of the parameter, at least one of detected age of the electrical device.

The value of the parameter may change over time and/or the value of the parameter may differ across frequency ranges.

The emissions of distinct electronic components on a circuit board may be associated with the corresponding distinct physical electronic components on the circuit board.

The executable instructions, when executed by the one or more processors, may further cause the one or more processors to determine a type of and/or classify the electrical device.

The digital representations of electromagnetic emissions may be compared and contrasted with a specific focus on at least one of emission homogeneity, consistency, and uniformity.

The method may further comprise the step of providing a calibration Device specimen, the step of capturing emissions radiating from the calibration specimen and the step of defining a calibrating emission signature.

The method may further comprise the step of combining results of at least one of spectrographic analysis, frequency analysis, time-frequency analysis, electromagnetic emission radiation response analysis, input signal variations, phase analysis, informatics analysis, and statistical analysis for at least one of the feature values with results of at least one of spectrographic analysis, frequency analysis, time-frequency analysis, electromagnetic emission radiation response analysis, input signal variations, phase analysis, informatics analysis, and statistical analysis for at least one of another feature value in at least one frequency region from at least one time interval.

In any of the embodiments RF emissions can comprise one or more emissions. In other words, the apparatus can be employed to capture a first emission, then removed or moved outside of the effective emission field, for example such as a near field, and brought back to capture a second emission prior to performing any measurements or processing of such captured RF emissions.

In one embodiment, the highly sensitive RF energy collection apparatus is a traditional RF receiver.

In another embodiment the ultra-sensitive RF energy collecting device is a photon detector that operates in the RF energy spectrum.

In another exemplary embodiment, the apparatus or method can be further used to detect malicious software that may be encoded in a standard programming language.

In another embodiment the highly sensitive RF energy collection apparatus is a cryogenically cooled receiver. In one embodiment the system has a noise figure of less than 5. In another embodiment the system has a noise figure of less than 1. In another embodiment the system has a noise figure less than 0.1.

One exemplary embodiment uses direct analysis of the input unintended emission analog signal converted into a digital output.

Another exemplary embodiment where higher frequencies can be required, utilizes a down conversion of the analog output prior to conversion to a digital signal.

In one embodiment, the highly sensitive receiver further uses Digital Signal Processing (DSP) hardware to further enhance the sensitivity of the receiver.

In one embodiment, the apparatus can comprises a weight of about 2.3 kg or less and wherein the housing comprises an envelope being less than or equal to about 255 mm long, about 125 mm wide, and about 100 mm high.

In an embodiment, the RF energy collection apparatus utilizes DSP filtering techniques to prepare the collected data for further processing by DSP algorithms.

One embodiment is directed to improve sensitivity of the receiver uses a Fast Fourier Transform (FFT).

In an example, the FFT is utilized in excess of 1 Million points. In another exemplary embodiment, the FFT is utilized in excess of 255 Thousand points. In an example, the FFT is utilized in excess of 16 thousand points. In an example, the FFT is implemented on an embedded chip within the RF collection apparatus.

In another exemplary embodiment, an apparatus uses unintended electromagnetic energy in the RF spectrum to detect aging in device electrical and electronic devices.

In another exemplary embodiment, an apparatus detects aging in electrical and electronic devices and includes means for comparing signature of emitted RF energy with baseline RF characteristics.

In another exemplary embodiment, an apparatus provides for testing a large number of functioning parts, subsystem or complete system simultaneously and/or sporadically, continuously, occasionally, a limited number of times, a fixed time duration, or periodically. Here multiple different possible aging levels in different parts or subsystems can be simultaneously tested.

In another exemplary embodiment, an automated apparatus may be configured to accomplish the test of multiple parts, systems or subsystems within an operational system, subsystem or devices simultaneously for the existence of unacceptably aged discrete semiconductor, integrated circuit, printed circuit board, circuit board assembly, system, sub-systems generally.

In another exemplary embodiment, an apparatus or method may be configured to inspect fully populated circuit boards to determine if the board contains the proper software or firmware when compared to a modified or unmodified standard.

In another exemplary embodiment, an apparatus may be configured to inspect fully populated circuit board and determine specifically what improper software is associated with which parts on the board and which parts contain proper, desired or authentic software, firmware or hardware patterns.

In another exemplary embodiment, an apparatus detects proper or improper device's software, firmware, hardware or malware in electrical and electronic devices that eliminates complex testing of entire functionality of an electrical or electronic component or device.

In another exemplary embodiment, a method is provided for detection of aging in the process of normal operations that includes the continuous monitoring of emissions from circuitry.

In an embodiment, a method is provided for active disablement of a device system containing detected excessively aged components, discrete semiconductor, integrated circuit, printed circuit board, circuit board assembly, system, sub-systems in electrical and electronic devices that include the continuous monitoring of emissions from circuitry.

In an embodiment, a completed Device board or system is analyzed to determine what component versions can be present and operational, and/or if all subsystems and functionality is present using their emitted signatures.

In an embodiment, a complete device is analyzed to determine the relative or absolute location of a software or hardware component based on its emissions or a comparison of its emissions with a known standard.

In an embodiment, a digital signal input is provided to an electronic device, complete board or system to invoke a state which presents unintended RF emissions which can be then received to determine the aging on the an electronic device, complete board or system.

Another exemplary embodiment provides an apparatus collecting unintendedly emitted electromagnetic energy, wherein the apparatus uses electronic device information derived from the expected operating parameters of the device being tested to assess that the electronic device being tested has aged to a specified degree.

Another exemplary embodiment provides an apparatus comprising: an antenna, a receiver, configured, in combination with the antenna, to receive at least one unintended emission of an unintended electromagnetic energy, the at least one unintended emission being given off by at least one electrical device; a means to acquire conducted emissions; at least one processor; wherein the processor is operable to monitor the at least one electrical device by measuring and processing a change or changes in a signature of the at least one electromagnetic unintended emission and comparing it with the acquired conducted emissions; and wherein the device is configured to determine aging of a component of the at least one electrical device based on the signature change or changes.

Another exemplary embodiment provides an apparatus comprising: an antenna, a receiver, configured, in combination with the antenna, to receive at least one unintended emission of an unintended electromagnetic energy, the at least one unintended emission being given off by at least one semiconductor device; at least one processor; wherein the device is configured to passively measure and process a change or changes in a signature of the at least one unintended electromagnetic emission and is further configured to assess at least one of aging and degradation during a quality control inspection.

Another exemplary embodiment provides an apparatus comprising: (a) an attached or attachable antenna, (b) a receiver, configured, in combination with the antenna, to receive at least one unintended emission of an unintended electromagnetic energy, the at least one unintended emission being given off by at least one electrical device without an aid from a hardwire connection, (c) at least one processor, wherein the device is configured to measure and process change or changes in a signature of the at least one electromagnetic unintended emission and is further configured to monitor a level of probability of the existence of excessive level of aging in the at least one electrical device.

Another exemplary embodiment provides an apparatus comprising: a housing sized to be held by a hand of a user; an antenna disposed within the housing, a receiver disposed within the housing, the receiver configured, in combination with the antenna, to receive at least one unintended emission of an unintended electromagnetic energy, the at least one unintended emission being given off by at least one electrical device, at least one processor disposed within the housing, and wherein the device is configured to determine at least one of RUL, aging, unacceptably high level of aging, imminent failure, and failure of the device with at least one electromagnetic unintended emission. It is also contemplated some embodiments of the instant subject matter are capable of diagnosing, distinguishing, or evaluating the aging of separate individual comprised parts, component, subsystem, board, interconnect or module within the device for failure prevention, diagnostics, RUL evaluation, sales price estimate, purchase price estimate, parts salvage efficacy as spare parts evaluation, or other evaluation purposes. It is clear that in some circumstances, one device such as a communications radio may have a board such as a transmit board which is detected to be substantially aged while another identical device may have a power supply substantially aged. The instant subject matter can thus be used to determine optimal swapping between units to increase overall lifetime of both, saving cost of earlier replacement. As an example, a unit's transmitter may be used extensively, almost always when powered up, and another unit may have only received signals but had been left on and powered up for extended periods of time. Thus it is evident in this situation that the power supply of the unit which was substantially receive only can be swapped with the power supply of the unit which used its transmitter board substantially, and similarly the unit which rarely transmits should swap out its transmitter board with a much greater RUL than the unit which has used its transmitter board substantially and whose transmitter board has a substantially shorter RUL. In this way it is evident that the lifetime of both devices can be optimized, saving the cost of early replacement on both units. As a more specific example using the above, if the transmitter board of the degraded highly transmitter-used unit has 20% RUL and the transmitter board of the slightly degraded seldom transmitter-used unit has 80% RUL, while the power supply of the highly transmitter-used unit has 80% RUL and the power supply of the seldom transmitter-used unit which has been left powered on for extended periods of time has 20% RUL, then the swap of power supply and transmitter unit can be expected to extend the RUL of both by 80%, saving the replacement cost and also yielding a substantial 'internal rate of return' on the interest of the money saved by prematurely replacing both units. It is envisioned a pool of data can be interfaced with and obtained using the instant subject matter on an information pool or database of device, which may be located in 'internet cloud storage', and an optimization algorithm can be used to determine which components of which units may be swapped to optimize RUL and reduce overall equipment costs. Further, this system may take into account other maintenance cost factors such as the man-hour cost of removing device and swapping boards. The subject matter thus may have a sporadic, continuous, occasional, periodic or conditional communication connection to the internet via wireless or wired link to its computer, FPGA, CPU or other processing means. For example, the handheld processing unit 1202 may be carried by its user to a location with Wi-Fi access to the internet and the RUL data and associated equipment data is then downloaded and used to populate a database.

Further, the above cost optimization method may be used on expensive electronic equipment, or equipment which is no longer manufactured to determine efficacy of extending total RUL lifetime of an expensive electronic equipment or an overall set of expensive electronic equipment. This also may be extended to evaluate obsolete individual used parts for suitability for placement or replacement of parts on a new or repaired board respectively. The instant subject matter may be used to place a monetary value on a part, system, subsystem, board, component, module, connector, device, industrial equipment, appliances, or any device containing electronic components which degrade over time or usage. For example, an avionic's unit costing $100,000 and determined to have a RUL of 50% may have a calculated value of $50,000 based on the formula: Cost×RUL/(Total Lifetime)=Remaining Value.

Thus, in an embodiment, therein is disclosed a method of performing a Condition Based Maintenance (CBM) as opposed to schedule based maintenance, which is common in a number of applications. Furthermore, the method for performing CBM is based on measuring and analyzing RUL value. Here, the maintenance is performed when RUL value in an indicator showing that device is going to fail or that device performance is deteriorating. The hand-held apparatus, for example such as apparatus of FIGS. 1-3, or in situ installed apparatus obviate a disadvantage of conventional CBM in that higher than desirable installation costs that, at times, may exceed the value of the DUT. In an example, a method of CBM comprises a hand-held apparatus that is configured to connect to the DUT with a cable. In an example, a method of CBM comprises a hand-held apparatus that is configured with a shield. In an example, a method of CBM comprises a hand-held apparatus that is configured with a horn-shaped antenna sized and shaped to form a shield with DUT. In an example, a method of CBM comprises an apparatus that is mounted within the DUT and at least comprises an antenna coupled to a user connection.

Another exemplary embodiment provides an apparatus containing at least one processor comprises a Field Programmable Gate Array (FPGA) processor configured to conduct an initial processing of a targeted analog signal and wherein the at least one processor further comprises a general purpose processor (GPU) coupled to the FPGA processor and configured to perform higher level processing of the analog signal, the higher level processing including at least one of comparing the signal to a predetermined signature, accessing a non-volatile memory provided within the device so as to store historical records of RUL values, and interfacing with a user.

Another exemplary embodiment provides an apparatus wherein the FPGA processor is further configured to transform a digital waveform of the emitted spectrum from the at least one device electrical device to a frequency domain of interest.

Another exemplary embodiment provides an apparatus further comprising a cascade integrated comb (CIC) filter configured to decimate a frequency signal, and wherein the FPGA processor is further configured to apply Fast Fourier Transform (FFT) to the frequency signal.

Another exemplary embodiment provides an apparatus wherein the FPGA and GPU can be configured to process the frequency domain from device and can be further configured to identify inconsistencies in the digital waveform from an anticipated, baseline or exemplary waveform from a known good or new device with 100% RUL for example.

Another exemplary embodiment provides an apparatus, wherein the receiver is a radio frequency (RF) receiver configured to extract a desired target frequency from a raw signal emitted by a device and received from the apparatus' antenna.

Another exemplary embodiment provides an apparatus, wherein the at least one processor includes a Field Programmable Gate Array (FPGA) configured to convert the target frequency to a baseband frequency.

Another exemplary embodiment provides an apparatus, wherein the at least one processor is configured to extract a desired target frequency from a raw signal received from the antenna.

Another exemplary embodiment provides an apparatus, wherein the at least one processor is configured to transform a time domain digital waveform of the emitted spectrum from the at least one electrical device to a frequency domain of interest.

Another exemplary embodiment provides a computer-implemented method comprising: receiving an unintended electromagnetic energy emission from an Device source with an antenna connected to a receiver; and using a processor to: select a candidate harmonic of a device from an expected spectral region of the Unintended electromagnetic energy emission, use a frequency location of the candidate harmonic to determine frequency locations of additional harmonics, identify, from the received Unintended electromagnetic energy emission, at least two of the additional harmonics, measure a phase of each harmonic, and compare the measured phases to determine RUL of circuitry.

Another exemplary embodiment provides a computer-implemented method used to differentiate harmonic content of the Device source from electro-magnetic background noise.

Another exemplary embodiment provides a computer-implemented method used for detection of at least one electronically triggered event associated with RUL of circuitry.

Another exemplary embodiment provides a computer-implemented method used to perform diagnostics on a physically selected electronic device, an electrical component, and a combination thereof for determining RUL of circuitry. Physical selection may be performed by location and/or orientation of the subject matter and especially subject matter's antenna relative to the DUT under test.

Another exemplary embodiment provides a computer-implemented method used to aid in RF spectroscopy.

Another exemplary embodiment provides a computer-implemented method wherein the source is an electrical device.

Another exemplary embodiment provides an apparatus comprising: an antenna, a receiver connected to the antenna and configured to receive an unintended electromagnetic energy emission, and at least one processor configured to: select a candidate harmonic of a device from an expected spectral region of the unintended electromagnetic energy emission, use a frequency location of the candidate harmonic to determine frequency locations of additional harmonics, identify, from the received Unintended electromagnetic energy, at least two of the additional harmonics, measure a phase of each harmonic, and compare the measured phases to at least one of identify the device containing circuitry and to determine its associated RUL.

Another exemplary embodiment provides an apparatus wherein the device electromagnetic emission measurement device is configured to include an analog to digital converter that is part of a receiver, part of the at least one processor, or implemented as a stand-alone component and a combination thereof.

Another exemplary embodiment provides an apparatus wherein the processor is further configured to add an error term to each device spectrum region's signal phase or phase noise measurement and change each phase measurement to a phase range measurement.

Another exemplary embodiment provides an apparatus wherein the processor is further configured to calculate a time vector for each harmonic of a device or component within device and to plot time vectors in a time-domain waveform.

Another exemplary embodiment provides an apparatus wherein the processor is further configured to intersect the time vectors, to identify an intersecting vector and to determine a value of the intersecting vector.

Another exemplary embodiment provides an apparatus wherein the processor is configured to classify the unintended electromagnetic energy emission as interference in absence of the frequency locations for the at least two additional harmonics.

Another exemplary embodiment provides an apparatus comprising: a receiver, an electromagnetic source for enhancing at least one RF emission signature, wherein the receiver is configured to detect at least one device or component within device by measuring at least one unintended enhanced RF emission given off by the at least one device or component within device and enhanced by the electromagnetic source, wherein the receiver is positioned on a first platform and the electromagnetic source is positioned on a second platform, the first platform and the second platform being coordinated to improve performance of measuring the RUL of the device or component within device.

Another exemplary embodiment provides an apparatus comprising: a receiver, wherein the receiver is configured to detect at least one device's RUL by passively measuring at least one unintended RF emission given off by the at least one electronic device or component within device, wherein the RF emission measurement device verifies a previously claimed, downloaded from database, or estimated RUL.

Another exemplary embodiment provides an apparatus, wherein such predetermined electronic equipment contains at least one of an oscillator, a voltage control oscillator, a ceramic resonator, a local oscillator, a high precision oscillator of at least $10^{-6}$, an oscillator with accuracy of $10^{-8}$ or better created by an atomic clock, TXCO, GPS stabilized clock, and a stable local oscillator.

Another exemplary embodiment provides an apparatus wherein the receiver samples electromagnetic emissions of such predetermined electronic Device or component within device and the emitter means emits energy at frequencies selected based on anticipated characteristics of such predetermined electronic Device or component within Device.

Another exemplary embodiment provides an apparatus wherein the frequencies correspond to such clocks of such predetermined electronic equipment.

Another exemplary embodiment provides a measuring apparatus, wherein the predetermined Device or component within device emissions can be one of at a same, multiple and sub multiple of a frequency of an unintended electromagnetic energy of the emitter.

Another exemplary embodiment provides a measuring apparatus, wherein an unintended electromagnetic energy of the emitter is at least one of tuned to and amplify electromagnetic emissions of such predetermined electronic component by an applied electromagnetic field generated by the Device or component within device.

Another exemplary embodiment provides an apparatus comprising a receiver, wherein such targeted device emissions signature received by the receiver is used specifically to tune the emitter to frequencies contained within such targeted device emissions signature to facilitate more efficient coupling of unintended electromagnetic energy into electronics of such targeted device.

Another exemplary embodiment provides the above system wherein the means for determining the condition of the electrically powered device includes: (a) a first means for collecting RF energy emitted from the electrically powered device; (b) a second means for matching collected RF energy to a set of predetermined parameters; and (c) a third means for determining if a match to the predetermined set of parameters is sufficient.

Another exemplary embodiment provides the above system wherein the first means includes an automated mechanism for collecting the RF energy from the device.

Another exemplary embodiment provides a method wherein the step of determining the device containing circuitry includes the step of analyzing at least one of frequency locations of emissions components, phases of emissions, cross-modulation and intermodulation components generated by the internal circuitry, shape of any individual emission, quality factors of any individual emissions or timing characteristics of emissions.

Another exemplary embodiment provides a method wherein a step includes the step of using at least one automated algorithm.

Another exemplary embodiment provides a method further including the step of establishing the baseline RF characteristics representative of the modified or unmodified device's RUL.

Another exemplary embodiment provides a method wherein the step of establishing the baseline RF characteristics includes the step of large scale comparison of spectral emissions and the step of reducing the large scale comparison to a single scalar value.

Another exemplary embodiment provides a system for electronically steering detection of a device containing Device including an antenna and low noise amplifier mounted within an integrated circuit.

Another exemplary embodiment utilizing the aforementioned device or component within device is mounted within an aircraft and wherein the RF energy collection and processing means is responsive to RF energy emitted by at least one device or component within Device in the aircraft.

Another exemplary embodiment utilizing the aforementioned system is configured to provide at least one of modification detection, modification monitoring, unmodification detection, unmodification monitoring, software changes monitoring, and firmware changes monitoring of Device or component within Device.

Another exemplary embodiment is configured to operate wherein the at least one emission is at least one of unintended properties of intended emissions and unintended emissions.

Another exemplary embodiment is configured to operate wherein the unintended electromagnetic energy is in a Radio Frequency spectrum.

Another exemplary embodiment is configured to operate wherein the at least one emission is at least one of a microwave or millimeter emission.

Another exemplary embodiment is configured to detect the at least one device emission through at least one of a window, door or wall of a structure.

Another exemplary embodiment is configured to detect the at least one device emission from a greater distance using a high gain antenna such as a dish antenna or a Yagi.

Another exemplary embodiment is configured to operate wherein the first means includes: (a) an antenna; (b) an emission collection device coupled to the antenna and configured to output an emission signal; and (c) means for processing the emission signal.

Another exemplary embodiment is configured to include a low noise amplifier, a tuner, and a digital to analog converter.

Another exemplary embodiment is configured to operate as an emission collection device with a receiver having at least one receiver channel.

Another exemplary embodiment is configured to operate as an emission collection device with a receiver having multiple receiver channels processing emissions of different frequency regions separately.

Another exemplary embodiment is configured to operate as an emission collection device with a receiver having multiple receiver channels processing different s emissions of different devices separately.

Another exemplary embodiment is configured to operate in a manner wherein the means for processing the emission signal includes: (a) a digital filter; (b) means for processing the emission signal in a time domain; and (c) means for processing the emission signal in a frequency domain independently from the means for processing the emission signal in the time domain.

Another exemplary embodiment is configured to operate in a manner wherein the means for processing the emission signal further includes means for at least reducing noise of the emission signal processed in the frequency domain.

Another exemplary embodiment is configured to operate in a manner further including at least one transform domain so as to enhance detection, identification, location, geolocation and diagnostics of the at least one device.

Another exemplary embodiment is configured to operate in a manner which further includes means for weighting output from at least one of the means for processing the emission signal in the time domain and the means for processing the signal in the frequency domain.

Another exemplary embodiment is configured to operate in a manner wherein the means for processing the emission signal in the time domain or in the frequency domain is configured to execute a plurality of algorithms.

Another exemplary embodiment is configured to operate in a manner further including a means for matching the processed emission signal against a template containing at least one emission signature.

Another exemplary embodiment is configured to operate in a manner further including a means for matching the processed emission signal which is configured to execute one or more algorithms that can be orthogonal algorithms.

Another exemplary embodiment is configured to operate in a manner further including at least two algorithms operating in parallel to each other that processes an independent characteristic of the at least one emission of the at least one device or component within device.

Another exemplary embodiment is configured to operate in a manner further wherein each of the at least two algorithms operable based on physically collected data.

Another exemplary embodiment is configured to operate in a manner further including means for weighting output of each of the least two algorithms so as to enhance probability of detection of the at least one device or component within device.

Another exemplary embodiment is configured to operate in a manner further wherein the means for weighting output includes another algorithm.

Another exemplary embodiment is configured to operate in a manner further including means for outputting a final score.

Another exemplary embodiment is configured to operate in a manner further including a threshold defined by a probability of a detection of the at least one Device wherein the final score is compared with the threshold.

Another exemplary embodiment may include a display.

Another exemplary embodiment is configured to detect emissions of at least one other device or component within Device located in close proximity to the at least one device or component within device.

Another exemplary embodiment may include means for identifying the at least one other device or component within device.

In another exemplary embodiment, the system is configured to detect a device or component within device that is at least one of beginning to display signs of degradation and show signs of imminent failure.

In another exemplary embodiment, the system includes at least one health monitoring device for device or component within Device and wherein the system is configured to interface with the at least one health monitoring device so as to enhance at least one of health monitoring and status monitoring of electronic devices.

In another exemplary embodiment, the system includes at least one health monitoring device for device or a component within device and at least one backup device and wherein the system is configured to interface with each of the at least one health monitoring device and the at least one back up device so as to facilitate prompt switchover thereto.

In another exemplary embodiment, the data storage includes a library of signatures identifying at least one of the at least one device or component within device and at least one other Device or component within device and wherein the signatures were generated by at least one of the first and second means.

In another exemplary embodiment, the system is configured as a turnkey system.

In another exemplary embodiment, the system includes a database of emission data derived from free field emission data, near field emission data, or far field emission data of at least two devices or component within device that have been pre-measured.

Another exemplary embodiment is envisioned, wherein the third means includes a pair of signatures, one of the pair of signatures defining the at least one emission and another one of the pair of signatures defining the set of parameters from a device or component within equipment.

In another exemplary embodiment, the third means includes a signature template of the at least one device or component within equipment.

In another exemplary embodiment, the signature template includes data from indirect emission measurement from the at least one Device or component within equipment.

In another exemplary embodiment, a set of pre-recorded from manufacturer's specification or from measured parameters includes at least one of: (a) a clock; (b) a processor type; (c) a transmission frequency; (d) power supply switching frequencies; (e) a transmission speed of data; (f) a microcontroller type; (g) timing protocols of the at least one device or component within device; and (h) a configuration of the at least one Device or component within the equipment.

In another exemplary embodiment, the emission signature template includes at least one of: (a) single peak characteristics; (b) multiple peak characteristics; (c) harmonically correlated characteristics; (d)non-harmonically correlated characteristics; (e) time correlated characteristics; (f) phase correlated characteristics; and (g) duty cycle characteristics.

Another exemplary embodiment is envisioned, wherein the first means at least one of: (a) a peak detection algorithm; (b) multiple peak detection algorithm; (c) harmonic correlation algorithm; (d) non-harmonic correlation algorithm; (e) time correlation algorithm; (f) phase correlation algorithm; and (g) duty cycle timing correlation algorithm.

Another exemplary embodiment is envisioned, wherein the signature template includes pre-measured or pre-established by manufacturer's parameters of the at least one Device or one components within equipment.

In another exemplary embodiment, the system is configured to perform diagnostics on the RF emissions from device or components within equipment.

In another exemplary embodiment, the system is configured to perform health monitoring based on the RF emissions from device or components within equipment.

In another exemplary embodiment, the means for determining the condition of the device or components within Device includes: (a) a first means for collecting RF energy emitted from the electrically operating device or components within device; (b) a second means for matching collected RF energy to a set of predetermined parameters; and (c) a third means for determining if a match to the predetermined set of parameters is sufficient.

In another exemplary embodiment, the first means includes an automated mechanism for collecting the RF energy from the device or components within equipment.

In another exemplary embodiment, the means for comparing the signature of the RF emissions from device or components within the device includes at least one of Harmonic Analysis, Matched Filter, Artificial Neural Networks (ANN), specifically multilayer perception (MLP) feed-forward ANN with back propagation (BP), Wavelet Decomposition, Autocorrelation, Spectral Feature Measurements or Statistics, Clustering or Phase Detrending.

Another exemplary embodiment is envisioned, wherein the means for processing digitized RF emissions to extract signatures of the RF emissions from device or components within device includes at least one of Discrete Fourier Transform, Fast Fourier Transform, Discrete Cosine Transform, Laplace Transform, Z Transform, Star Transform, Short-Time Fourier Transform, Cepstrum, Infinite Impulse Response Filter, Finite Impulse Response Filter, Cascaded integrator-comb filter, Elliptical Filter, Chebyshev Filter, Butterworth Filter, or Bessel Filter.

Another exemplary embodiment is envisioned, wherein the RF collection means from device or components within device has a sensitivity of better than −149 dBm.

Another exemplary embodiment provides a method, wherein the step of determining the RUL of the device includes the step of analyzing at least one of frequency locations of emissions components, phases of emissions, cross-modulation and intermodulation components generated by the internal circuitry, shape of any individual emission, quality factors of any individual emissions or timing characteristics of emissions.

Another exemplary embodiment provides a method, further including the step of establishing the baseline RF characteristics representative of the degraded or undegraded semiconductor based device or system.

Another exemplary embodiment provides a method, wherein the step of establishing the baseline RF characteristics includes the step of obtaining local spectral power density statistics.

Another exemplary embodiment provides a method, wherein the step of obtaining local spectral power density statistics of Device or components within Device includes the step of sampling a plurality of Device or components within Device and discriminating between the plurality of device or components within Device based on localized statistical feature measured on each of emissions common between sampled device or components within equipment.

Another exemplary embodiment provides a method, wherein the statistical features acquired from Device or components within Device includes at least one of Emission Frequency Location, Emission Peak Magnitude, Emission Phase Noise, Emission Symmetry, Skewness, and Emission Local Noise Floor.

Another exemplary embodiment provides a method, wherein the step of comparing the characteristics of the RF emissions from Device or components within device includes the step of obtaining relative phase measurement.

Another exemplary embodiment provides a method, wherein the step of comparing the characteristics of the RF emissions from the RF emissions from device or components within Device includes the step of performing clustering analysis.

Another exemplary embodiment provides a method, wherein the step of performing the clustering analysis of the RF emissions from device or components within device includes the step of using at least one of a clustering algorithm and a Hierarchical Agglomerative Clustering (HAC) algorithm.

Another exemplary embodiment provides a method, wherein the step of comparing the characteristics of the RF emissions of the RF emissions from device or components within device includes the step of obtaining discrete wavelet transform coefficient statistics.

In an embodiment, a hand-held testing apparatus comprises a housing; a horn-shaped antenna coupled to one end of the housing, the antenna configured to capture one or more emissions of an electromagnetic energy in a radio-frequency (RF) range, the one or more emissions of the electromagnetic energy being emitted from an electrical device; one or more position sensing devices mounted on an exterior surface of the horn-shaped antenna; a receiver mounted within the housing and coupled to the antenna, the receiver configured to receive the electromagnetic energy captured by the antenna and at least convert the one or more emissions captured by the antenna from an analog form to a digital form; a user interface accessible from outside of the housing; one or more processors; and a memory that is not a transitory propagating signal, the memory connected to the one or more processors and encoding computer readable instructions, including processor executable program instructions, the computer readable instructions accessible to the one or more processor, wherein the processor executable program instructions, when executed by the one or more processors, cause the one or more processors to perform operations comprising generate a digital signal in a time domain, the digital signal characterizing the one or more emissions, convert the digital signal from the time domain to a frequency domain, the digital signal containing a signature of the one or more emissions, process the signature of the one or more emissions, and determine a condition of the electrical device in a response to the processed signature.

A feature of this embodiment is that the horn antenna being sized and shaped to receive a portion of the electrical device in a direct contact between an interior surface of the horn antenna and a peripheral edge of the electrical device, the direct contact forming a shield during capture of the one or more emissions.

A feature of this embodiment is that the one or more position sensing devices comprises three distance measuring sensors equally spaced therebetween about the exterior surface of the housing, each of the three sensors disposed to align with a unique target on or around the electrical device.

A feature of this embodiment is that the user interface comprises alpha-numeric keys.

A feature of this embodiment is that the user interface comprises a graphical user interface.

A feature of this embodiment is that the user interface comprises a display configured to at least display the detected condition of the electrical device.

A feature of this embodiment is that the hand-held testing apparatus can further comprise a communication interface that communicates the detected condition to a remote location.

A feature of this embodiment is that the remote location is a computer server.

A feature of this embodiment is that the condition comprises at least one of a performance degradation, an aging level, a remaining useful lifetime (RUL), and a quality assessment.

A feature of this embodiment is that the receiver comprises a circuit, the circuit comprising a low noise amplifier (LNA), a splitter, a tuner, an analog to digital converter (ADC), and a clock.

A feature of this embodiment is that the receiver comprises a circuit, the circuit comprising a low noise amplifier (LNA), a tuner, an analog to digital converter (ADC), a Digital Down Converter (DDC), and a Cascade Integrator-Comb (CIC) filter.

A feature of this embodiment is that the condition is being determined in a relationship to a condition of a baseline electrical device.

A feature of this embodiment is that the one or more emissions comprises unintentional emission or unintentional aspects of intentional emissions.

A feature of this embodiment is that the antenna comprises a high gain non-integrated antenna.

A feature of this embodiment is that the condition comprises a remaining useful life (RUL) value.

A feature of this embodiment is that the apparatus comprises a weight of about 2.3 kg or less and wherein the housing comprises an envelope being less than or equal to about 255 mm long, about 125 mm wide, and about 100 mm high.

In an embodiment, a hand-held apparatus that tests at least one electrical instrument from a plurality of electrical instruments mounted in an instrument panel, each electrical device having one end thereof protruding above a surface of the instrument panel, the hand-held apparatus comprises a housing; a horn-shaped antenna coupled to one end of the housing, the antenna configured to capture one or more emissions of an electromagnetic energy in a radio-frequency (RF) range, the one or more emissions of the electromagnetic energy being emitted from one or more electrical devices from the plurality of electrical devices, the horn antenna being sized and shaped to receive the protruding one end of the one or more electrical devices in a direct contact between an interior surface of the horn antenna and a peripheral edge of the one end, the direct contact forming a shield during capture of the one or more emissions; one or more position sensing devices mounted on an exterior surface of the horn-shaped antenna;

a receiver mounted within the housing and coupled to the antenna, the receiver configured to receive the electromagnetic energy captured by the antenna and at least convert the one or more emissions captured by the antenna from an analog form to a digital form; a user interface accessible from outside of the housing; one or more processors; and a memory that is not a transitory propagating signal, the memory connected to the one or more processors and encoding computer readable instructions, including processor executable program instructions, the computer readable instructions accessible to the one or more processor, wherein the processor executable program instructions, when executed by the one or more processors, cause the one or more processors to perform operations comprising generate a digital signal in a time domain, the digital signal characterizing the one or more emissions, convert the digital signal from the time domain to a frequency domain, the digital signal containing a signature of the one or more emissions, process the signature of the one or more emissions; and determine a condition of the electrical device in a response to the processed signature.

In an embodiment, an instrument panel assembly comprises an instrument panel with an exterior and interior surfaces; a plurality of instruments mounted within the instrument panel; an antenna mounted on or next to the interior surface, the antenna configured to capture one or more emissions of an electromagnetic energy in a radio-frequency (RF) range, the one or more emissions of the electromagnetic energy being emitted from one or more electrical instruments mounted within the instrument panel; a user interface connection mounted within the instrument panel and being accessible from the exterior surface; and a connection between the antenna and the user interface connection.

In an embodiment, an instrument panel assembly comprises an instrument panel with an exterior and interior surfaces; a plurality of instruments mounted within the instrument panel; an antenna mounted on or next to the interior surface, the antenna configured to capture one or more emissions of an electromagnetic energy in a radio-frequency (RF) range, the one or more emissions of the electromagnetic energy being emitted from one or more electrical instruments mounted within the instrument panel; a receiver mounted within the instrument panel and coupled to the antenna, the receiver configured to receive the electromagnetic energy captured by the antenna and at least convert the one or more emissions captured by the antenna from an analog form to a digital form; a user interface connection mounted within the instrument panel and being accessible from the exterior surface; and a connection between the receiver and the user interface connection. In this embodiment, the antenna can comprise any one of a loop antenna, a fractal antenna, a horn antenna, a dipole antenna, and an inverted-F antenna (PIFA).

In an embodiment, an instrument panel assembly comprises an instrument panel with an exterior and interior surfaces; a plurality of instruments mounted within the instrument panel; an antenna mounted on or next to the interior surface, the antenna configured to capture one or more emissions of an electromagnetic energy in a radio-frequency (RF) range, the one or more emissions of the electromagnetic energy being emitted from one or more electrical instruments mounted within the instrument panel; a receiver mounted within the instrument panel and coupled to the antenna, the receiver configured to receive the electromagnetic energy captured by the antenna and at least convert the one or more emissions captured by the antenna from an analog form to a digital form; a controller disposed within the instrument panel in an operative coupling with the receiver, the controller at least comprising one or more processors, and a memory that is not a transitory propagating signal, the memory connected to the one or more processors and encoding computer readable instructions, including processor executable program instructions, the computer readable instructions accessible to the one or more processor, wherein the processor executable program instructions, when executed by the one or more processors, cause the one or more processors to perform operations comprising generate a digital signal in a time domain, the digital signal representing the one or more emissions, convert the digital signal from the time domain to a frequency domain, the digital signal containing a signature of the one or more emissions, process the signature of the one or more emissions, and determine a condition of the one or more electrical instruments in a response to the processed signature.

In an embodiment, a chassis assembly comprises a housing (enclosure) having an open end; one or more computer/logic cards disposed within the housing and being accessible through the open end; a lid configured to selectively cover and uncover the open end of the housing; a transparent window within the lid; an apparatus being positioned on exterior of the lid in an alignment with the transparent window, the apparatus being at least configured to capture emissions of electromagnetic energy in a radio-frequency (RF) range, the one or more emissions of the electromagnetic energy being emitted from the one or more computer/logic cards; and a communication between the apparatus and an external environment.

A feature of this embodiment is that the apparatus comprises an antenna, the antenna configured to capture one or more emissions of an electromagnetic energy in a radio-frequency (RF) range, the one or more emissions of the electromagnetic energy being emitted from the one or more computer/logic cards, the communication comprising a cable in an operative coupling with the antenna.

A feature of this embodiment is that the apparatus comprises an antenna configured to capture one or more emissions of an electromagnetic energy in a radio-frequency (RF) range, the one or more emissions of the electromagnetic energy being emitted from the one or more computer/logic cards; and a receiver coupled to the antenna, the receiver configured to receive the electromagnetic energy captured by the antenna and at least convert the one or more emissions captured by the antenna from an analog form to a digital form; the communication comprising a cable in an operative coupling with the receiver.

A feature of this embodiment is that the apparatus comprises an antenna; a receiver coupled to the antenna, the receiver configured to receive the electromagnetic energy captured by the antenna and at least convert the one or more emissions captured by the antenna from an analog form to a digital form; and a controller coupled to the receiver, the controller operable to calculate a remaining useful life (RUL) value of the one or more computer/logic cards; the communication comprising a cable in an operative coupling with the controller.

In an embodiment, a method for performing Condition Based Maintenance (CBM) on an electrical device comprises steps of capturing, with an antenna, one or more unintended emissions of an electromagnetic energy in a radio-frequency (RF) range being emitted from the electrical device; receiving, with a receiver coupled to the antenna, the one or more captured unintended emissions; at least converting, with the receiver, the one or more captured unintended emissions from an analog form to a digital form; generating, with a processor, a digital signal in a time domain, the digital signal characterizing the one or more emissions; converting, with the processor, the digital signal from the time domain to a frequency domain, the digital signal containing a signature of the one or more emissions; processing, with the processor, the signature of the one or more emissions; and determining, with the processor, a condition of the electrical device in a response to the processed signature.

A feature of this embodiment is that determining the condition comprises calculating, with the processor, a remaining useful life (RUL) value of the electrical device.

In an embodiment, an article comprising a non-transitory tangible medium encoding computer-readable instructions implementing a method of using a computer system to determine remaining useful life (RUL) of an electrical device by automatically capturing, with an antenna, one or more unintended emissions of an electromagnetic energy in a radio-frequency (RF) range being emitted from the electrical device; receiving, with a receiver coupled to the antenna, the one or more captured unintended emissions; at least converting, with the receiver, the one or more captured unintended emissions from an analog form to a digital form; generating, with a processor, a digital signal in a time domain, the digital signal characterizing the one or more emissions; converting, with the processor, the digital signal from the time domain to a frequency domain, the digital signal containing a signature of the one or more emissions; processing, with the processor, the signature of the one or more emissions; and calculating, with the processor, the RUL value in a response to the processed signature.

In an embodiment, a method can comprise the step of combining results of at least one of spectrographic analysis, frequency analysis, time-frequency analysis, electromagnetic emission radiation response analysis, input signal variations, phase analysis, informatics analysis, and statistical analysis for at least one of the feature values with results of at least one of spectrographic analysis, frequency analysis, time-frequency analysis, electromagnetic emission radiation response analysis, input signal variations, phase analysis, informatics analysis, and statistical analysis in at least one frequency region from at least one time interval to determine device condition.

In an embodiment, one or more electronic devices are comprised of one of operational integrated circuits within operational electronic equipment, operational circuit boards within operational electronic equipment, operational electronic modules within electronic equipment operational, aged, near-end-of-life, or non-functional aviation assets and equipment.

In an embodiment, a method for determining at least one of aging, Remaining Useful Lifetime (RUL), or quality inspection prognostics on electrical or electronic device can comprise an integrated circuit (IC) composed of a fully integrated antenna, Low Noise Amplifier (LNA), analog Radio Frequency (RF) collection means, Digital to Analog converter, a processor and external interface collects, measures and compares RF electromagnetic emissions given off by the electrical or electronic device over pre-planned or unplanned intervals.

In an embodiment, an apparatus can comprise an electromagnetic energy sensor system and its necessary peripheral hardware is physically contained wholly within and atop the apparatus; and a hardware architecture within and connected to the apparatus being fully contained within or atop the case of the apparatus.

In an embodiment, all software architecture required for intended operational use of the apparatus can be fully contained within the apparatus; and addition of software patches, platforms, or externally connected software architectures beyond that which is contained completely within the apparatus is not required for intended operation of the apparatus.

In an embodiment, an apparatus can comprise a measurement registration mechanism, integrated with intent to make at least two registered measurements on a specific Device over time, which is comprised of one or more of an attached device serving as a physical stand-off, a gyroscope that provides relative position registration, a laser range finder that measures the distance from the apparatus to the device or component being tested, and an IC integrated into a handheld device that uses at least one of physical, IR, visual, acoustic or RF registration of measurements.

In an embodiment, the parameter value can be obtained from captured unintended emissions being given off by a baseline electrical device and wherein the one or more electrical devices can be determined and/or validated to be at least one of operational, new, aged to a degree, likely to imminently fail, loaded, burned-in, or functioning identically to the baseline electrical device.

In an embodiment, one or more electrical devices can have the antenna being integrated therewithin and configured to be connected to the apparatus for RUL measurement.

In an embodiment, one or more electrical devices can be a circuit board, a circuit assembly, or a circuit card assembly each including a plurality of electronic components.

In an embodiment, executable instructions, when executed by the one or more processors or logic devices, can cause the one or more processors or logic devices to perform an additional step of electromagnetic emissions analysis including at least one of a spectrographic analysis, a time-frequency analysis, an electromagnetic emission radiation response analysis related to input signal variations, a phase analysis, an informatics analysis, and a statistical analysis.

In an embodiment, an external interface can be at least one of a Graphic User Interface (GUI), wireless interface, infrared (IR) interface, or hard wired interface.

In an embodiment, the electromagnetic feature values can consist of quantifiable metrics associated with time-domain and/or frequency domain signals, including frequency, wavelength, amplitude, phase, peak width, Full-Width-Half-Maximum (FWHM), harmonic indices, harmonic spacing and peak position.

In an embodiment, a Remaining Useful Life (RUL) value can be calculated via statistical analysis, wherein the RUL is reported as a probability distribution over time, and/or is reported as a single value.

In an embodiment, an apparatus that determines at least one of electrical device age, Remaining Useful Life, or quality inspection prognostics on Electronic And Especially Avionics comprising an integrated circuit (IC) can comprise a fully integrated antenna, Low Noise Amplifier (LNA), analog Radio Frequency (RF) collection means, Digital to Analog converter, a processor and external interface collects, wherein the device measures and compares RF electromagnetic emissions given off by the Electronic And Especially Avionics over pre-planned or unplanned intervals.

A feature of this embodiment is that the IC can take the form of at least one of a System on a Chip (SoC), Device on a Chip (DoC) or generalized multi-die integrated configurations.

A feature of this embodiment is that the IC can be integrated into a wearable, handheld, portable or fixed device.

The above apparatuses, systems and methods may be implemented as a computer program executing on a machine, as a computer program product, or as a tangible and/or non-transitory computer-readable medium having stored instructions.

Tangible computer readable medium means any physical object or computer element that can store and/or execute computer instructions. Examples of tangible computer readable medium include, but not limited to, a compact disc (CD), digital versatile disc (DVD), blu-ray disc (BD), USB, floppy drive, floppy disk, random access memory (RAM), read-only memory (ROM), erasable programmable read-only memory (EPROM), optical fiber, etc. It should be noted that the tangible computer readable medium may even be paper or other suitable medium in which the instructions can be electronically captured, such as optical scanning. Where optical scanning occurs, the instructions may be compiled, interpreted, or otherwise processed in a suitable manner, if necessary, and then stored in computer memory.

The disclosed method may be implemented in the form of software stored on a computer-readable non-transitory information storage medium such as an optical or magnetic disk, a non-volatile memory (e.g., Flash or ROM), RAM, and other forms of volatile memory. The information storage medium may be an internal part of the computer, a removable external element coupled to the computer, or unit that is remotely accessible via a wired or wireless network.

Program code for carrying out operations for aspects of various embodiments may be written in any combination of one or more programming languages, including an object oriented programming language, such as Java, Smalltalk, C++, or the like, and conventional procedural programming languages, such as the "C" programming language or similar programming languages. In accordance with various implementations, the program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Although, various embodiments have been illustrated and described with emphasis an avionics controls, the various embodiments are applicable in other applications. It will be understood that instrument panels are commonly used on ships, submarines, trains, buses and even automobiles (dashboard). The number and type of instruments varies for each application. The various embodiments can be also applied to instruments within factory equipment, appliance, computer, computer peripheral, electronic device, such as an IC, electrical component, or a semiconductor, although it will be apparent to those with ordinary skill in the relevant art that the instant subject matter may be applied to other electrical or electronic devices such as boards, Physical Circuit Boards (PCBs), multi-chip modules, systems employing electronic device(s), sub-systems employing electronic device(s), single-board computers, electronic peripherals and the like and as such should not be interpreted as a limiting factor of the instant subject matter.

It should be appreciated that reference throughout this specification to "one embodiment" or "an embodiment", "exemplary embodiment" means that a particular feature, structure or characteristic described in connection with the embodiment is included in at least one embodiment of the disclosed subject matter. Therefore, it is emphasized and should be appreciated that two or more references to "an embodiment" or "one embodiment" or "exemplary embodiment" in various portions of this specification are not necessarily all referring to the same embodiment or the same variation. Furthermore, the particular features, structures or characteristics may be combined as suitable in one or more embodiments of the disclosed subject matter.

The chosen exemplary embodiments of the claimed subject matter have been described and illustrated for practical purposes so as to enable any person skilled in the art to which it pertains to make and use the same. It is therefore intended that all matters in the foregoing description and shown in the accompanying drawings be interpreted as illustrative and not in a limiting sense. It will be understood that variations, modifications, equivalents and substitutions for components of the specifically described exemplary embodiments of the subject matter may be made by those skilled in the art without departing from the spirit and scope of the subject matter as set forth in the appended claims.

Any element in a claim that does not explicitly state "means for" performing a specified function, or "step for" performing a specified function, is not to be interpreted as a "means" or "step" clause as specified in 35 U.S.C. § 112, ¶6. In particular, any use of "step of" in the claims is not intended to invoke the provision of 35 U.S.C. § 112, ¶6.

Furthermore, the Abstract is not intended to be limiting as to the scope of the claimed subject matter and is for the purpose of quickly determining the nature of the claimed subject matter.

What is claimed is:

1. A hand-held testing apparatus, comprising:
   a housing, said housing configured as a hand-held housing;
   a horn-shaped antenna coupled to one end of said housing, said horn-shaped antenna configured to capture one or more emissions of an electromagnetic energy in a radio-frequency (RF) range, said one or more emissions of said electromagnetic energy being emitted from an electrical device;
   one or more position sensing devices mounted on an exterior surface of said horn-shaped antenna;
   a receiver mounted within said housing and coupled to said horn-shaped antenna, said receiver configured to receive said electromagnetic energy captured by said horn-shaped antenna and at least convert said one or more emissions captured by said horn-shaped antenna from an analog form to a digital form;
   a user interface accessible from outside of said housing;
   one or more processors; and a memory that is not a transitory propagating signal, said memory connected to said one or more processors and encoding computer readable instructions, including processor executable program instructions, said computer readable instructions accessible to said one or more processor, wherein said processor executable program instructions, when executed by said one or more processors, cause said one or more processors to perform operations comprising:
generate a digital signal in a time domain, said digital signal characterizing said one or more emissions,
convert said digital signal from said time domain to a frequency domain, said digital signal containing a signature of said one or more emissions,
process said signature of said one or more emissions, and
determine a condition of the electrical device in a response to said processed signature.

2. The hand-held testing apparatus of claim 1, wherein said horn-shaped antenna being sized and shaped to receive a portion of the electrical device in a direct contact between an interior surface of said horn-shaped antenna and a peripheral edge of the electrical device, said direct contact forming a shield during capture of said one or more emissions.

3. The hand-held testing apparatus of claim 1, wherein said one or more position sensing devices comprises three distance measuring sensors equally spaced therebetween about said exterior surface of said horn-shaped antenna, each of said three sensors disposed to align with a unique target on or around said electrical device.

4. The hand-held testing apparatus of claim 1, wherein said user interface comprises alpha-numeric keys.

5. The hand-held testing apparatus of claim 1, wherein said user interface comprises a graphical user interface.

6. The hand-held testing apparatus of claim 1, wherein said user interface comprises a display configured to at least display said determined condition of the electrical device.

7. The hand-held testing apparatus of claim 1 further a communication interface that communicates said determined condition to a remote location.

8. The hand-held testing apparatus of claim 7, wherein said remote location is a computer server.

9. The hand-held testing apparatus of claim 1, wherein said condition comprises at least one of a performance degradation, an aging level, a remaining useful lifetime (RUL), and a quality assessment.

10. The hand-held testing apparatus of claim 1, wherein said receiver comprises a circuit, said circuit comprising a low noise amplifier (LNA), a splitter, a tuner, an analog to digital converter (ADC), and a clock.

11. The hand-held testing apparatus of claim 1, wherein said receiver comprises a circuit, said circuit comprising a low noise amplifier (LNA), a tuner, an analog to digital converter (ADC), a Digital Down Converter (DDC), and a Cascade Integrator-Comb (CIC) filter.

12. The hand-held testing apparatus of claim 1, wherein said condition is being determined in a relationship to a condition of a baseline electrical device.

13. The hand-held testing apparatus of claim 1, wherein said one or more emissions comprises unintentional emission or unintentional aspects of intentional emissions.

14. The hand-held testing apparatus of claim 1, wherein said horn-shaped antenna comprises a high gain non-integrated antenna.

15. The hand-held testing apparatus of claim 1, wherein said condition comprises a remaining useful life (RUL) value.

16. A hand-held apparatus that tests at least one electrical instrument from a plurality of electrical instruments mounted in an instrument panel, each electrical device having one end thereof protruding above a surface of the instrument panel, said hand-held apparatus comprising:

a housing, said housing configured as a hand-held housing;
a horn-shaped antenna coupled to one end of said housing, said horn-shaped antenna configured to capture one or more emissions of an electromagnetic energy in a radio-frequency (RF) range, said one or more emissions of said electromagnetic energy being emitted from one or more electrical devices from the plurality of electrical devices, said horn-shaped antenna being sized and shaped to receive the protruding one end of the one or more electrical devices in a direct contact between an interior surface of said horn-shaped antenna and a peripheral edge of the one end, said direct contact forming a shield during capture of said one or more emissions;
one or more position sensing devices mounted on an exterior surface of said horn-shaped antenna;
a receiver mounted within said housing and coupled to said horn-shaped antenna, said receiver configured to receive said electromagnetic energy captured by said horn-shaped antenna and at least convert said one or more emissions captured by said horn-shaped antenna from an analog form to a digital form;
a user interface accessible from outside of said housing;
one or more processor; and
a memory that is not a transitory propagating signal, said memory connected to said one or more processors and encoding computer readable instructions, including processor executable program instructions, said computer readable instructions accessible to said one or more processor, wherein said processor executable program instructions, when executed by said one or more processors, cause said one or more processors to perform operations comprising:
generate a digital signal in a time domain, said digital signal characterizing said one or more emissions,
convert said digital signal from said time domain to a frequency domain, said digital signal containing a signature of said one or more emissions,
process said signature of said one or more emissions, and
determine a condition of the electrical device in a response to said processed signature.

17. A method of testing an electrical instrument in an instrument panel, said method comprising:
aligning a horn-shaped antenna with said instrument;
capturing with said horn-shaped antenna an emission of an electromagnetic energy in a radio-frequency (RF) range, said emission of said electromagnetic energy being emitted from said electrical instrument;
receiving, with a receiver disposed within a hand-held housing coupled to said horn-shaped antenna, said electromagnetic energy captured by said horn-shaped antenna;
at least converting, with said receiver, said received emission from an analog form to a digital form; and
performing, with one or more processors and a memory that is not a transitory propagating signal and that includes a processor executable program instructions, said one or more processors and said memory disposed within said hand-held housing, operations when said processor executable program instructions being executed by said one or more processors, said operations comprising:
generating a digital signal in a time domain, said digital signal characterizing said emission;

converting said digital signal from said time domain to a frequency domain, said digital signal containing a signature of said emission, processing said signature of said emission, and determining a condition of said electrical instrument in a response to said processed signature.

18. The method of claim 17, wherein said aligning said horn-shaped antenna with said electrical instrument comprises:

mounting a position sensing device on an exterior surface of said horn-shaped antenna; and aligning said position sensing device with a target on or around said electrical instrument.

19. The method of claim 17, further comprising shielding said electrical instrument with said horn-shaped antenna.

20. The method of claim 17, further comprising integrating a low noise amplifier (LNA) into said horn-shaped antenna.

* * * * *